(12) United States Patent
Choi et al.

(10) Patent No.: US 12,302,758 B2
(45) Date of Patent: May 13, 2025

(54) THERMOELECTRIC DEVICE

(71) Applicant: LG INNOTEK CO., LTD., Seoul (KR)

(72) Inventors: Man Hue Choi, Seoul (KR); Jong Min Lee, Seoul (KR); Se Woon Lee, Seoul (KR); Yong Sang Cho, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 18/028,016

(22) PCT Filed: Jul. 20, 2021

(86) PCT No.: PCT/KR2021/009353
§ 371 (c)(1),
(2) Date: Mar. 23, 2023

(87) PCT Pub. No.: WO2022/065651
PCT Pub. Date: Mar. 31, 2022

(65) Prior Publication Data
US 2024/0040929 A1     Feb. 1, 2024

(30) Foreign Application Priority Data

Sep. 24, 2020  (KR) .................. 10-2020-0124094
Jul. 13, 2021  (KR) .................. 10-2021-0091531
Jul. 20, 2021  (KR) .................. 10-2021-0095001

(51) Int. Cl.
*H10N 10/17*     (2023.01)
(52) U.S. Cl.
CPC .................. *H10N 10/17* (2023.02)
(58) Field of Classification Search
CPC ........ H10N 10/17; H10N 10/81; H10N 10/82; H10N 10/854
See application file for complete search history.

(56) References Cited

U.S. PATENT DOCUMENTS

2011/0259385 A1*  10/2011  Hiroyama ............. H10N 10/17
                                                 136/224
2015/0179912 A1*   6/2015  Maeshima ............ H10N 10/17
                                                 136/211
(Continued)

FOREIGN PATENT DOCUMENTS

EP         0687020 A1 * 12/1995
JP         H08-97472       4/1996
(Continued)

OTHER PUBLICATIONS

Machine translation of EP-0687020-A1, Kishi Matsuo. (Year: 1995).*
(Continued)

*Primary Examiner* — Mayla Gonzalez Ramos
(74) *Attorney, Agent, or Firm* — KED & ASSOCIATES, LLP

(57) ABSTRACT

A thermoelectric device according to an embodiment of the present invention comprises: a first substrate; an insulating layer disposed on the first substrate; a first electrode unit disposed on the insulating layer; a first terminal electrode and a second terminal electrode disposed on the insulating layer and protruding from the first electrode unit toward the first outer side of the first substrate; a semiconductor structure disposed on the first electrode unit; a second electrode unit disposed on the semiconductor structure; and a second substrate unit disposed on the second electrode unit. The second substrate unit comprises a plurality of second substrates disposed away from one another. The first electrode unit comprises: a plurality of electrode groups respectively overlapping the plurality of second substrates vertically; and a first connection electrode connecting two different electrode groups among the plurality of electrode groups. The long side of the first connection electrode is longer than the long side of the first electrode included in the plurality of (Continued)

electrode groups. At least a part of the first connection electrode does not overlap the plurality of second substrates vertically.

14 Claims, 25 Drawing Sheets

(56) References Cited

U.S. PATENT DOCUMENTS

| | | | |
|---|---|---|---|
| 2020/0075830 A1* | 3/2020 | Spillner | ............ H10N 10/01 |
| 2020/0259060 A1 | 8/2020 | Jeon et al. | |

FOREIGN PATENT DOCUMENTS

| | | |
|---|---|---|
| JP | 2000-164945 | 6/2000 |
| JP | 2020-513695 | 5/2020 |
| KR | 10-2019-0085705 | 7/2019 |
| KR | 10-2019-0090928 | 8/2019 |
| KR | 10-2019-0093516 | 8/2019 |
| KR | 10-2019-0115967 | 10/2019 |
| KR | 10-2020-0094388 | 8/2020 |
| KR | 10-2020-0098391 | 8/2020 |
| WO | WO-2018108195 A1 * | 6/2018 ........... B60N 2/5692 |

OTHER PUBLICATIONS

International Search Report dated Oct. 22, 2021 issued in Application No. PCT/KR2021/009353.
Korean Office Action dated Nov. 11, 2024, issued in Application No. 10-2024-0148721.
Japanese Office Action dated Feb. 4, 2025, issued in Application No. JP 2023-519048.

* cited by examiner

[FIG. 1]
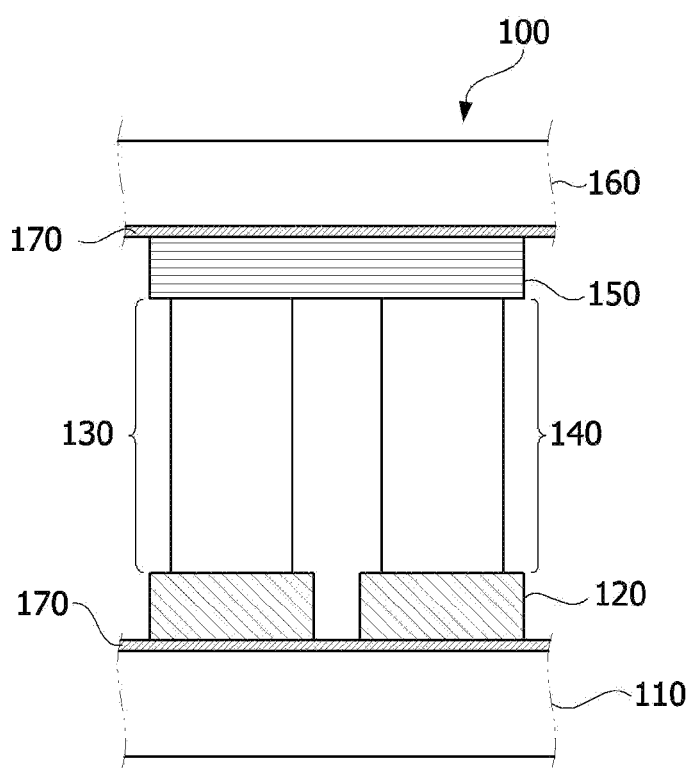

[FIG. 2]
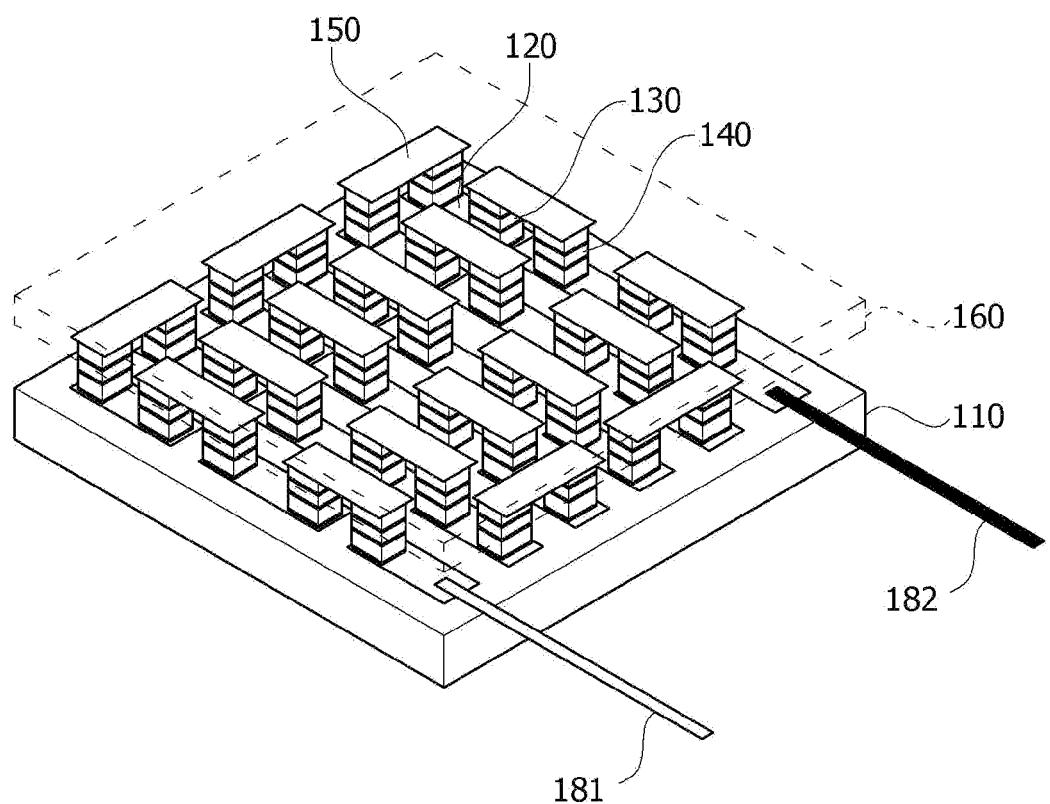

[FIG. 3]
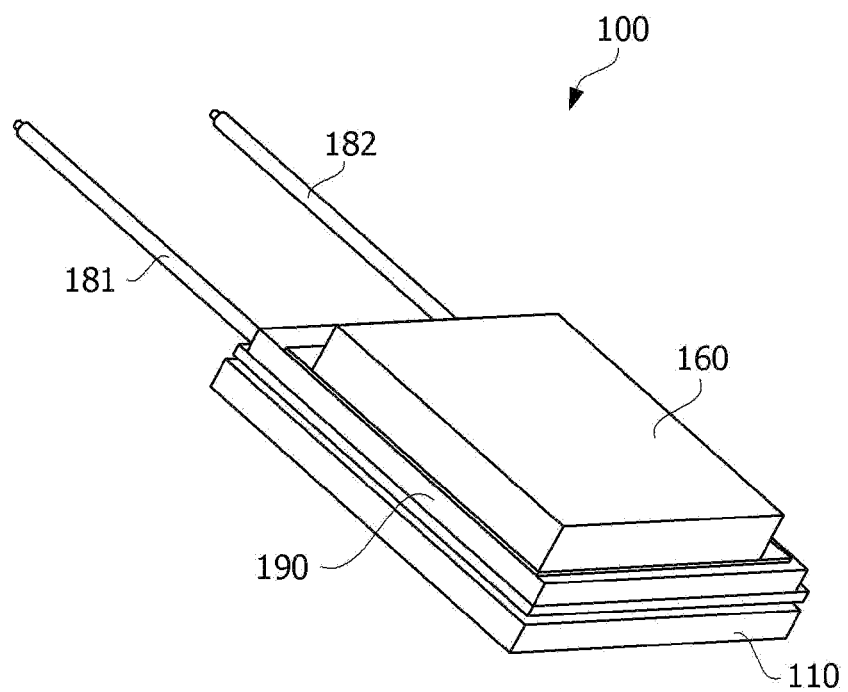

[FIG. 4]
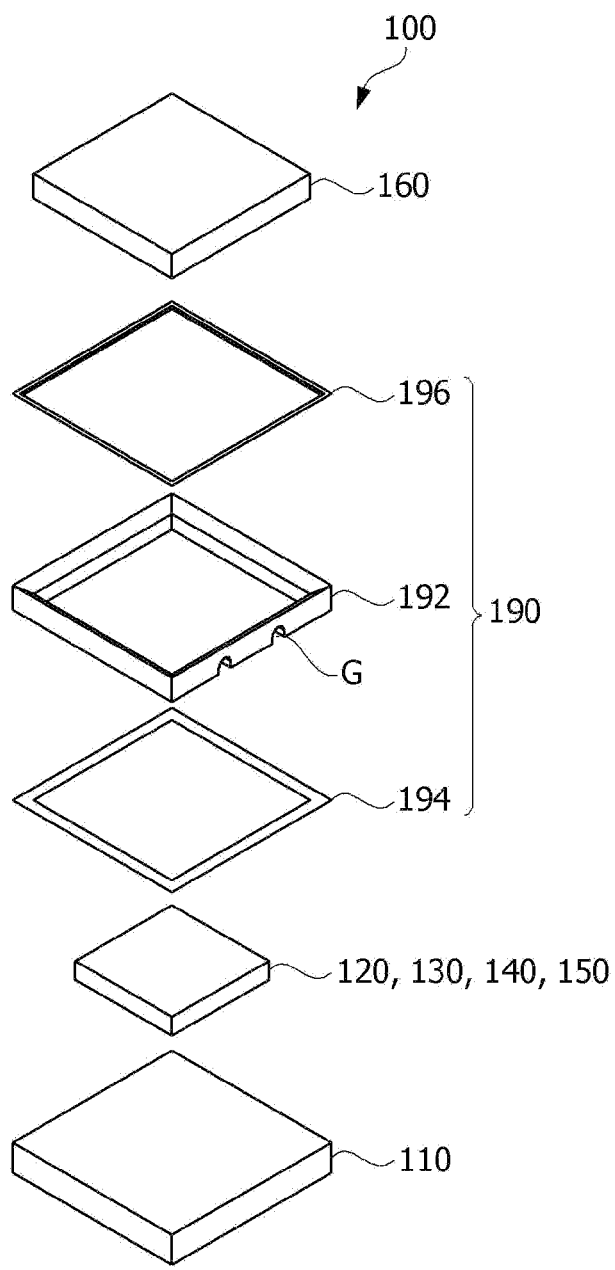

[FIG. 5]
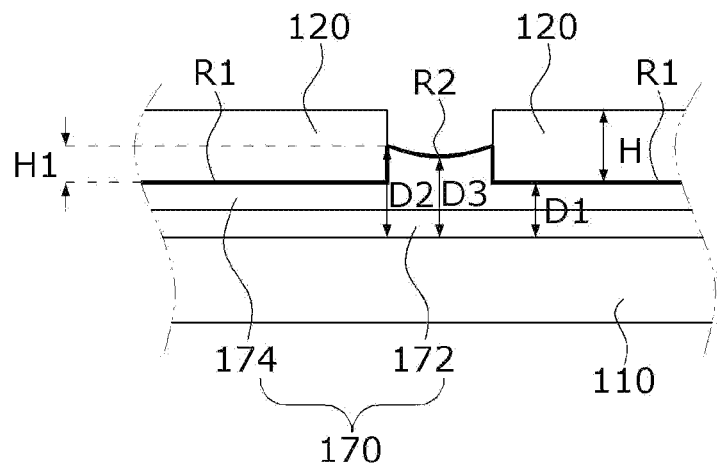
[FIG. 6]
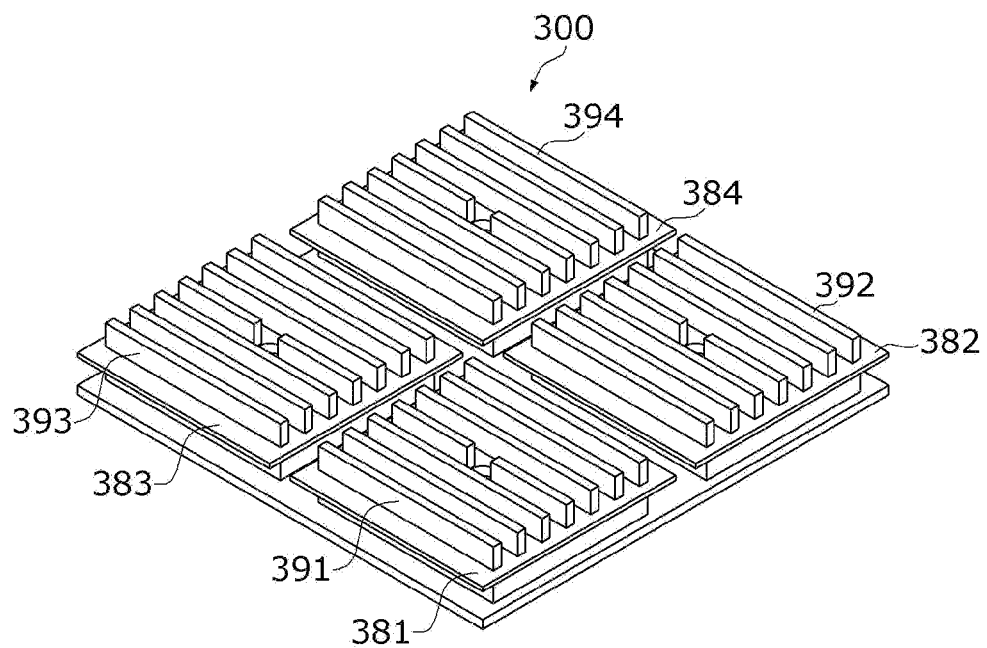
380: 381, 382, 383, 384
390: 391, 392, 393, 394

[FIG. 7]
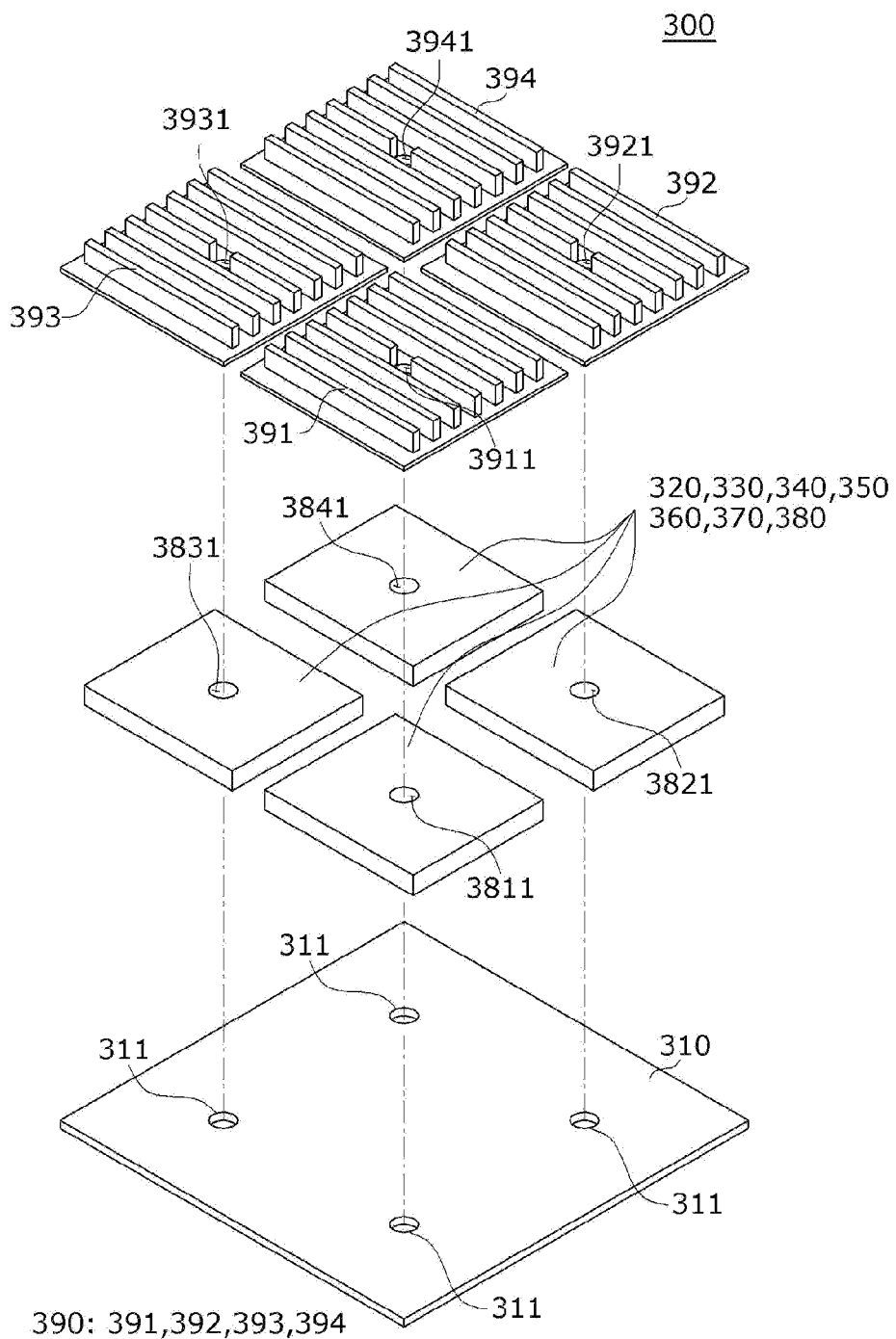

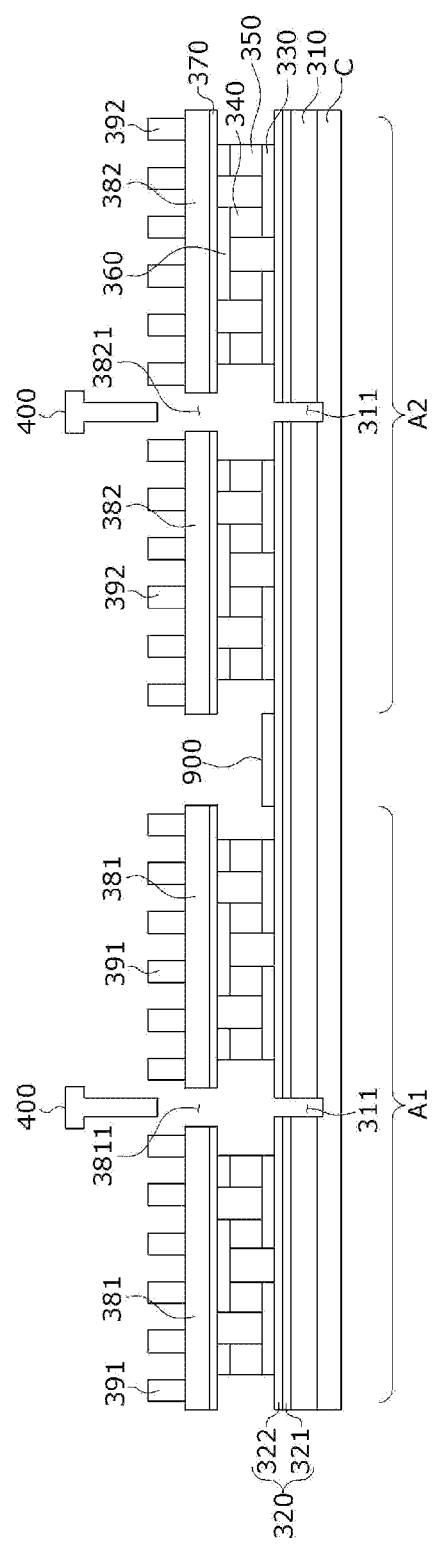

[FIG. 9]
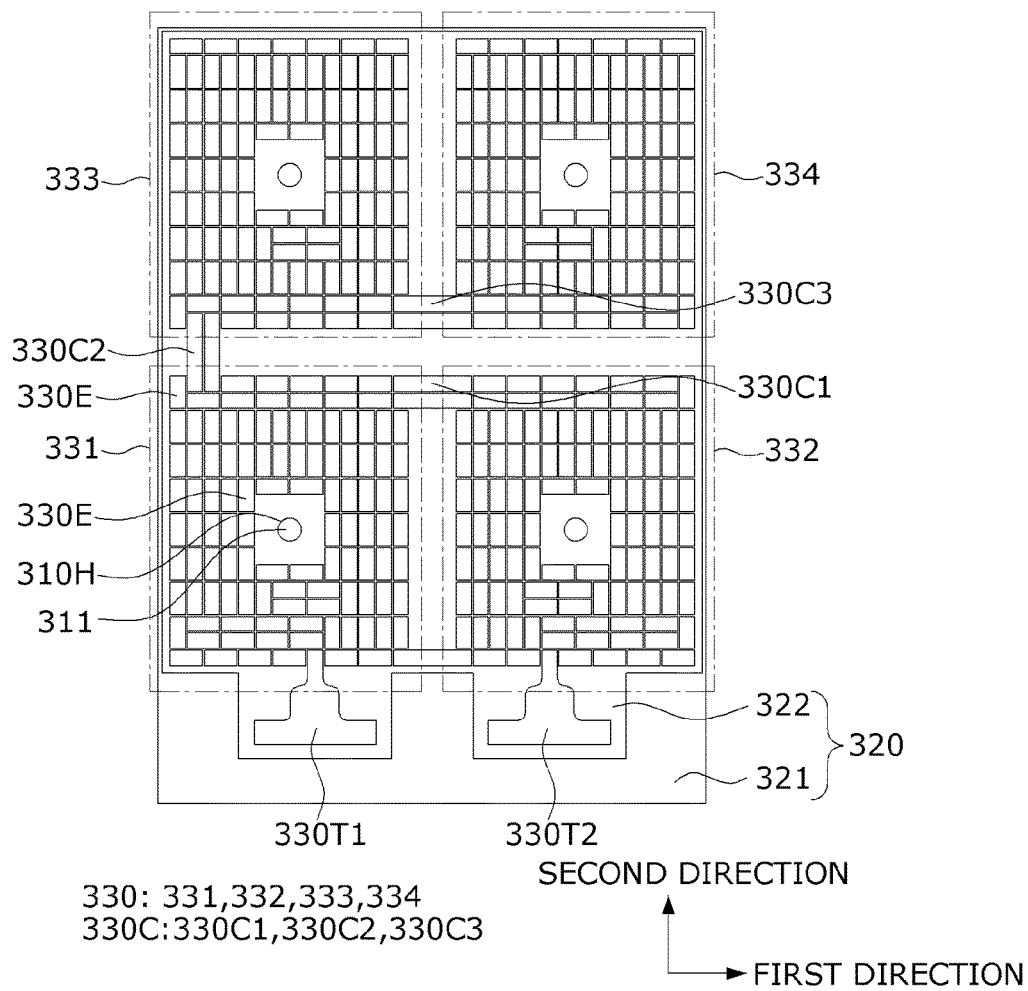

[FIG. 10]
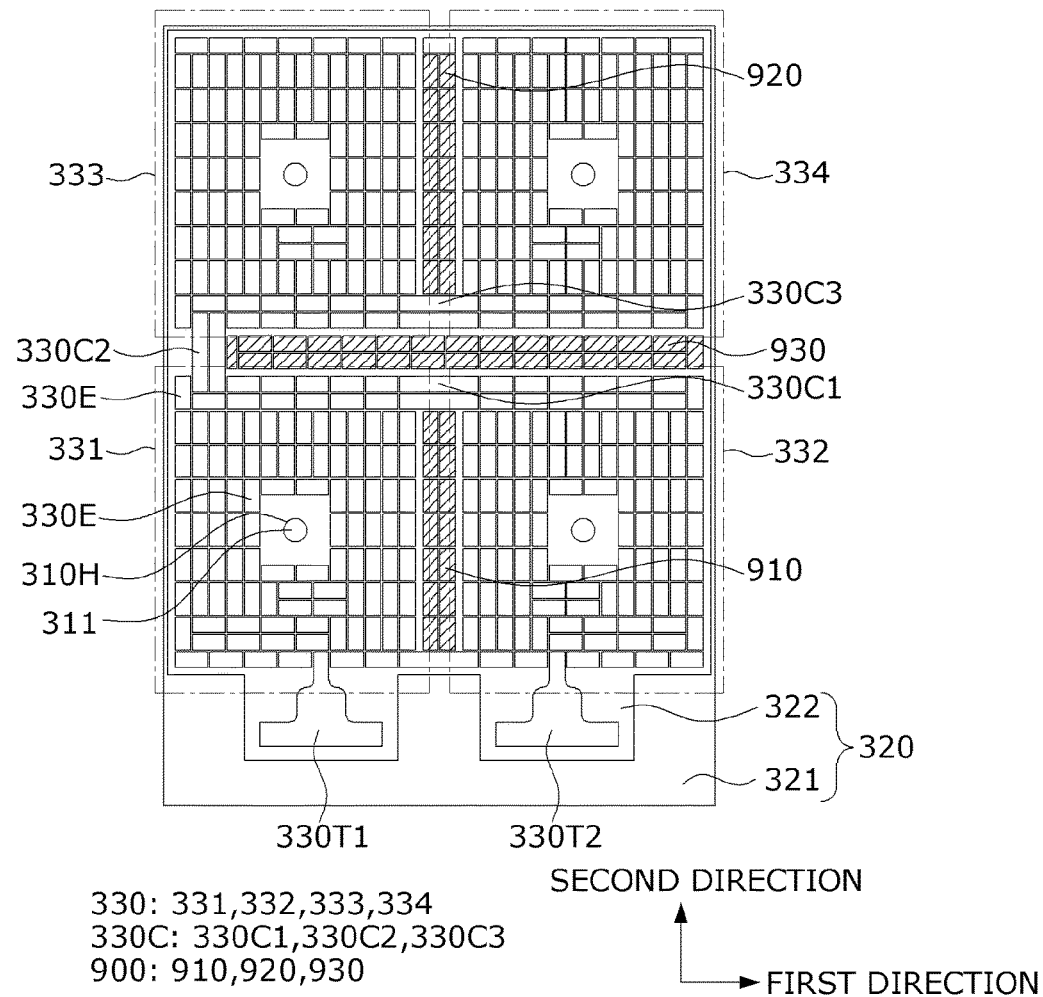

[FIG. 11]
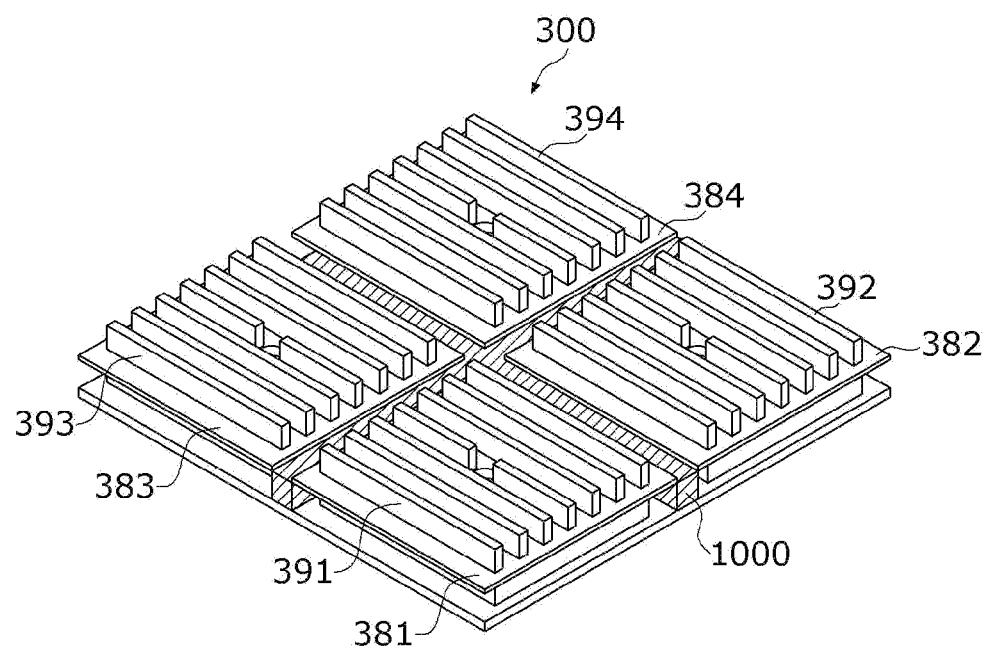
380: 381,382,383,384
390: 391,392,393,394

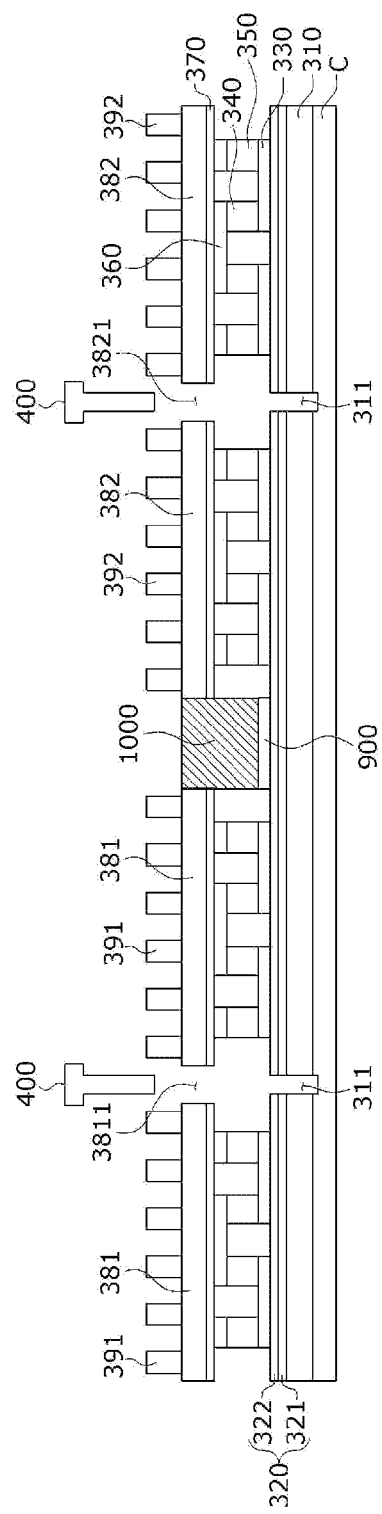
[FIG. 12]

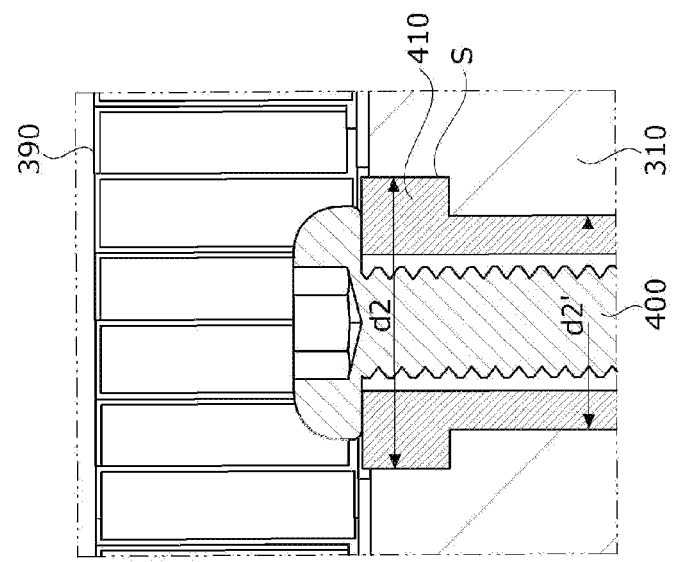
[FIG. 13B]
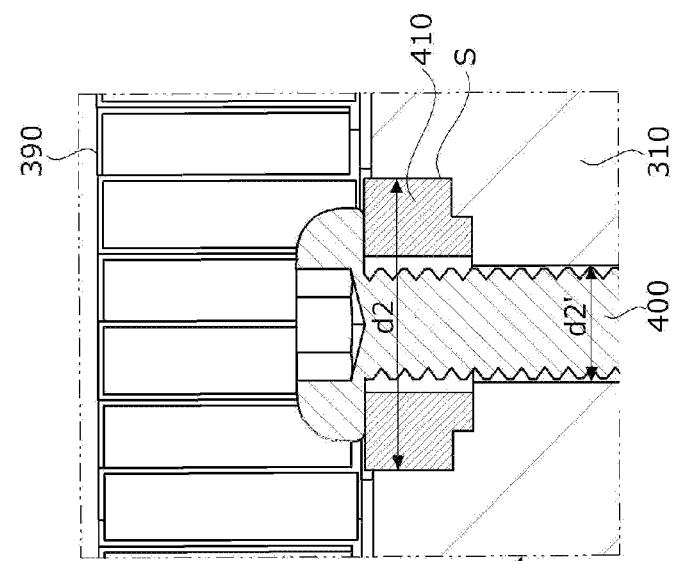
[FIG. 13A]

[FIG. 14A]
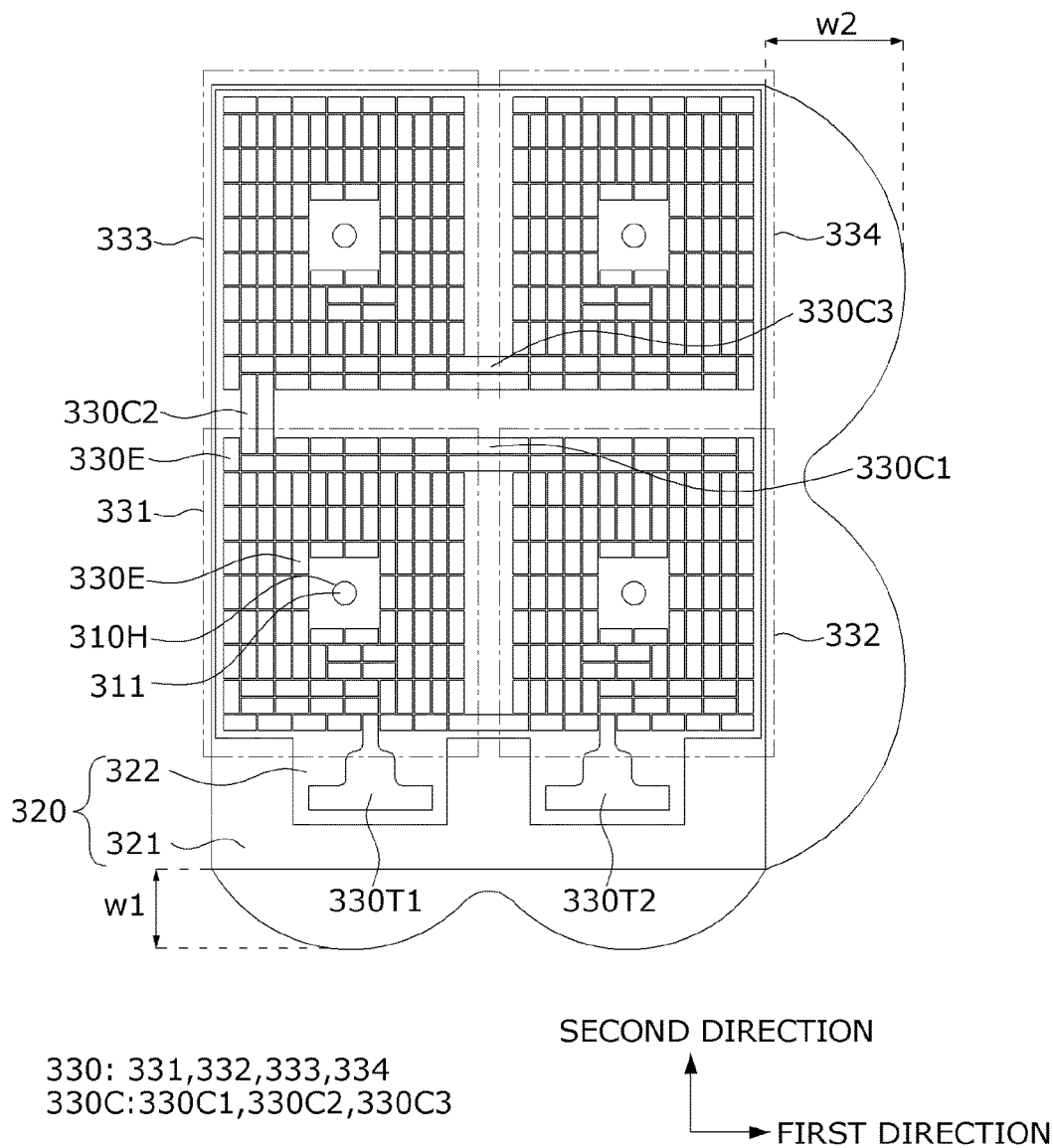

[FIG. 14B]
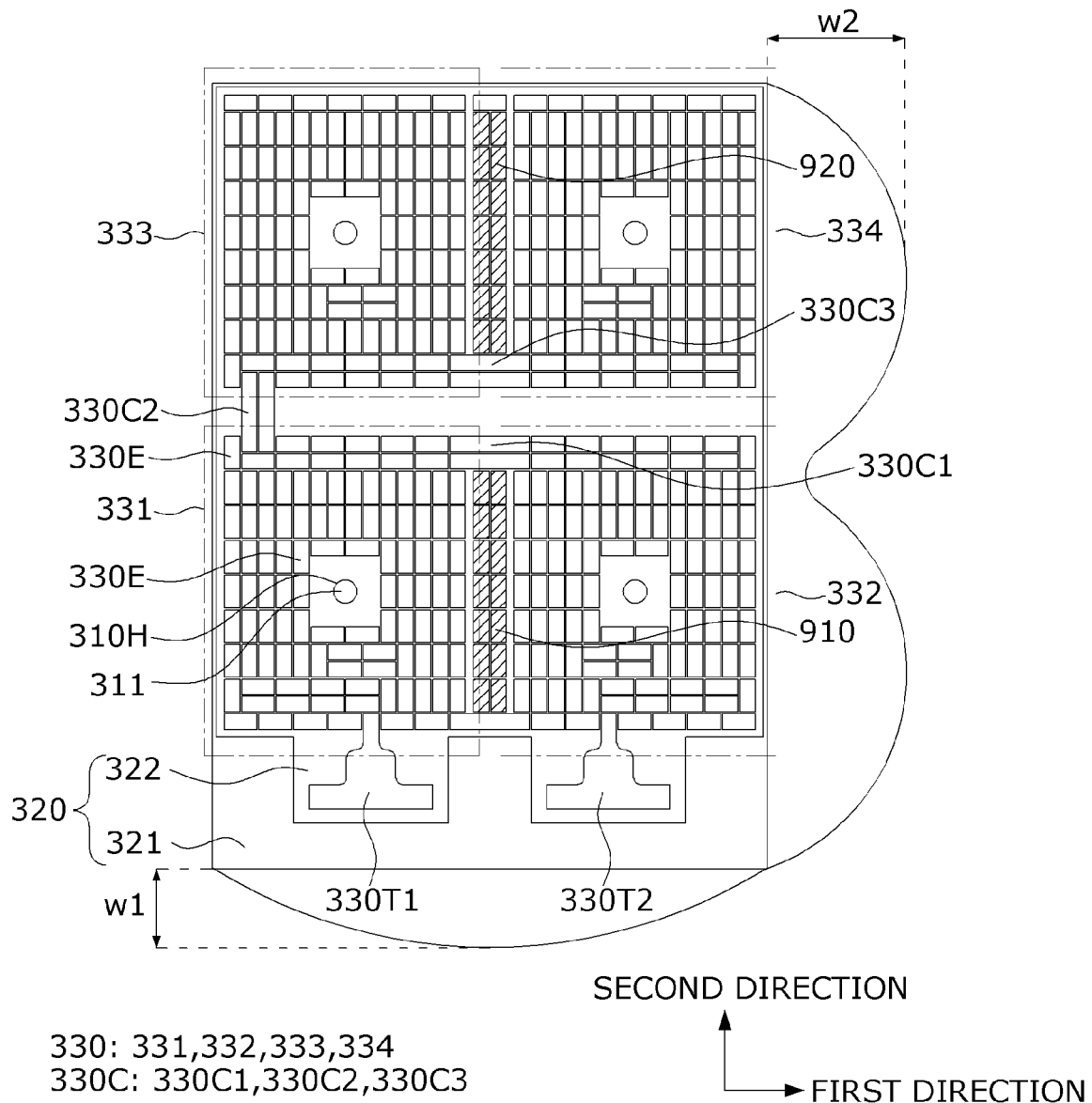

[FIG. 14C]
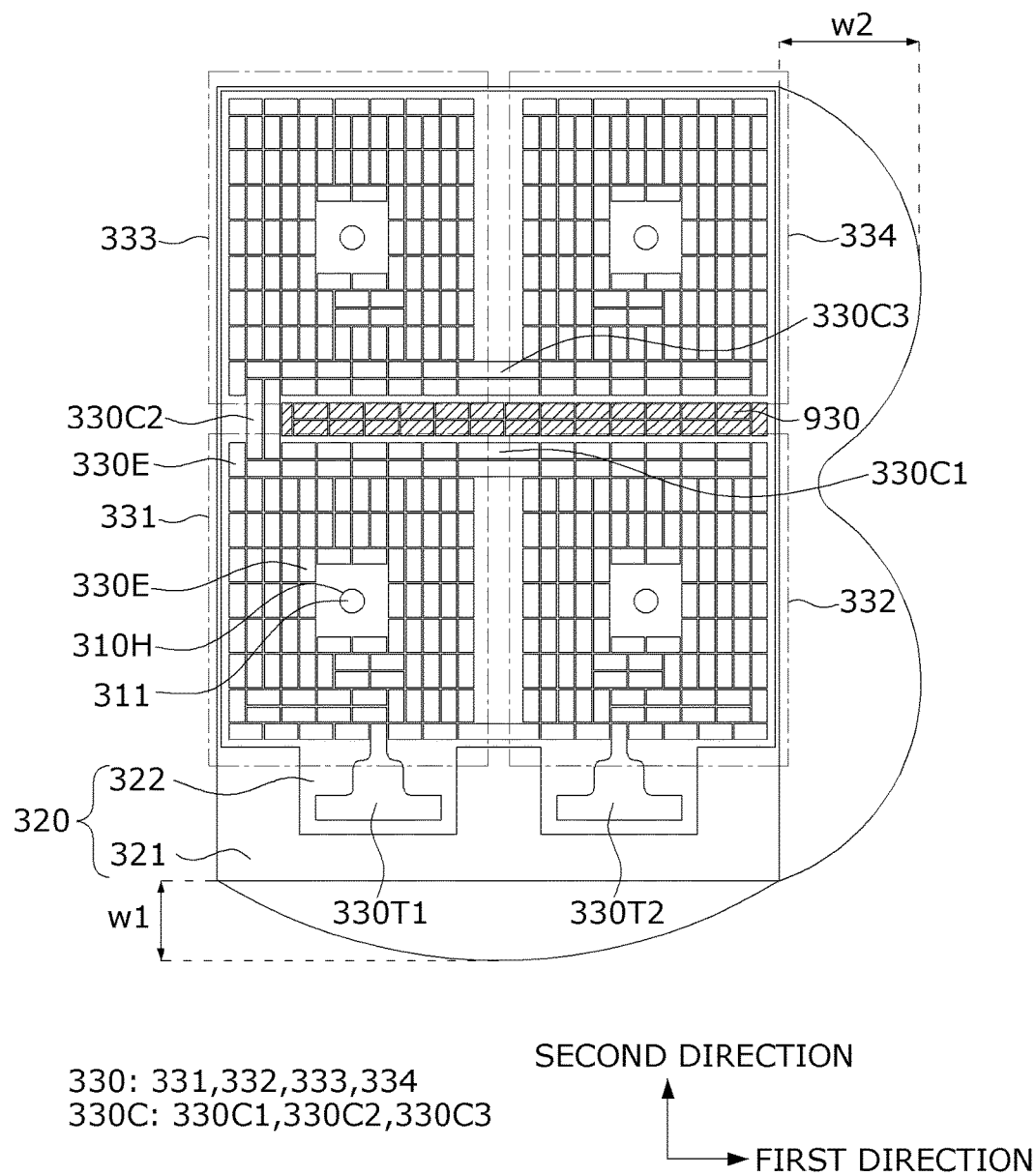
330: 331,332,333,334
330C: 330C1,330C2,330C3

[FIG. 14D]
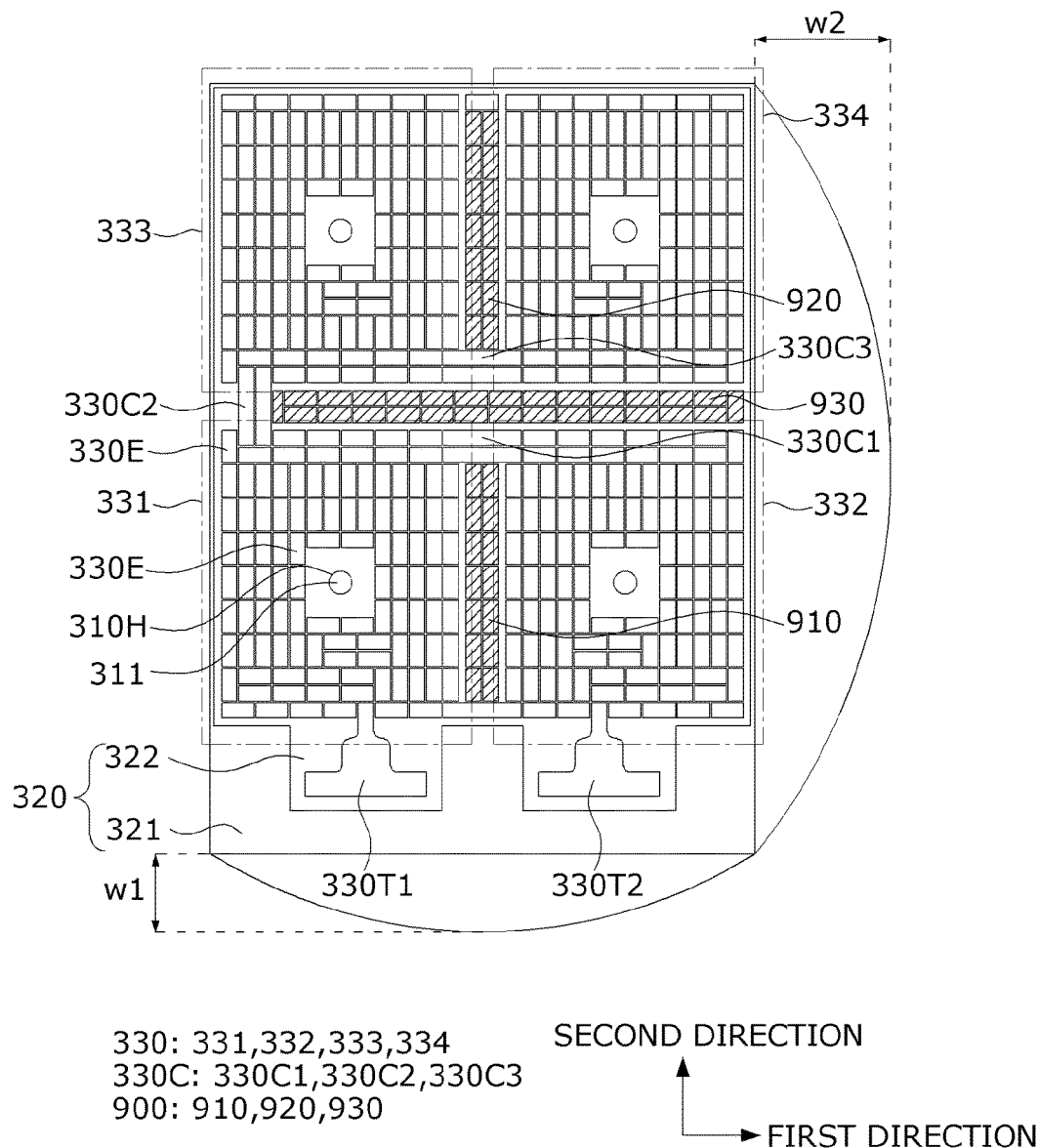
330: 331,332,333,334
330C: 330C1,330C2,330C3
900: 910,920,930
SECOND DIRECTION ↑
→ FIRST DIRECTION

[FIG. 15]
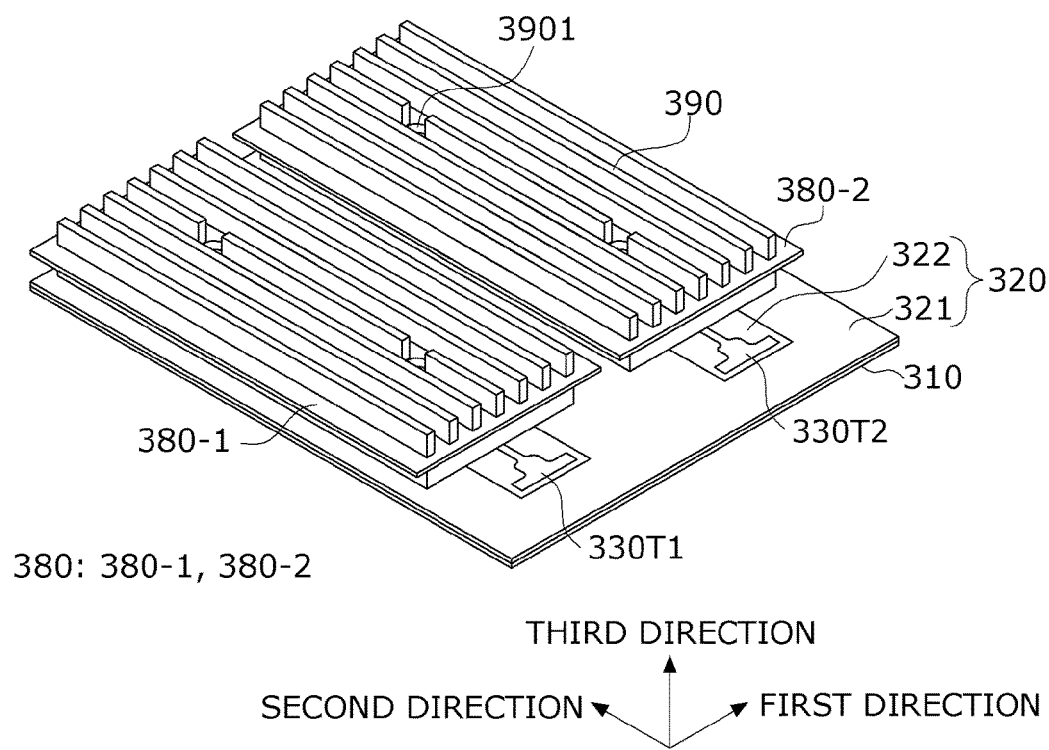

[FIG. 16]
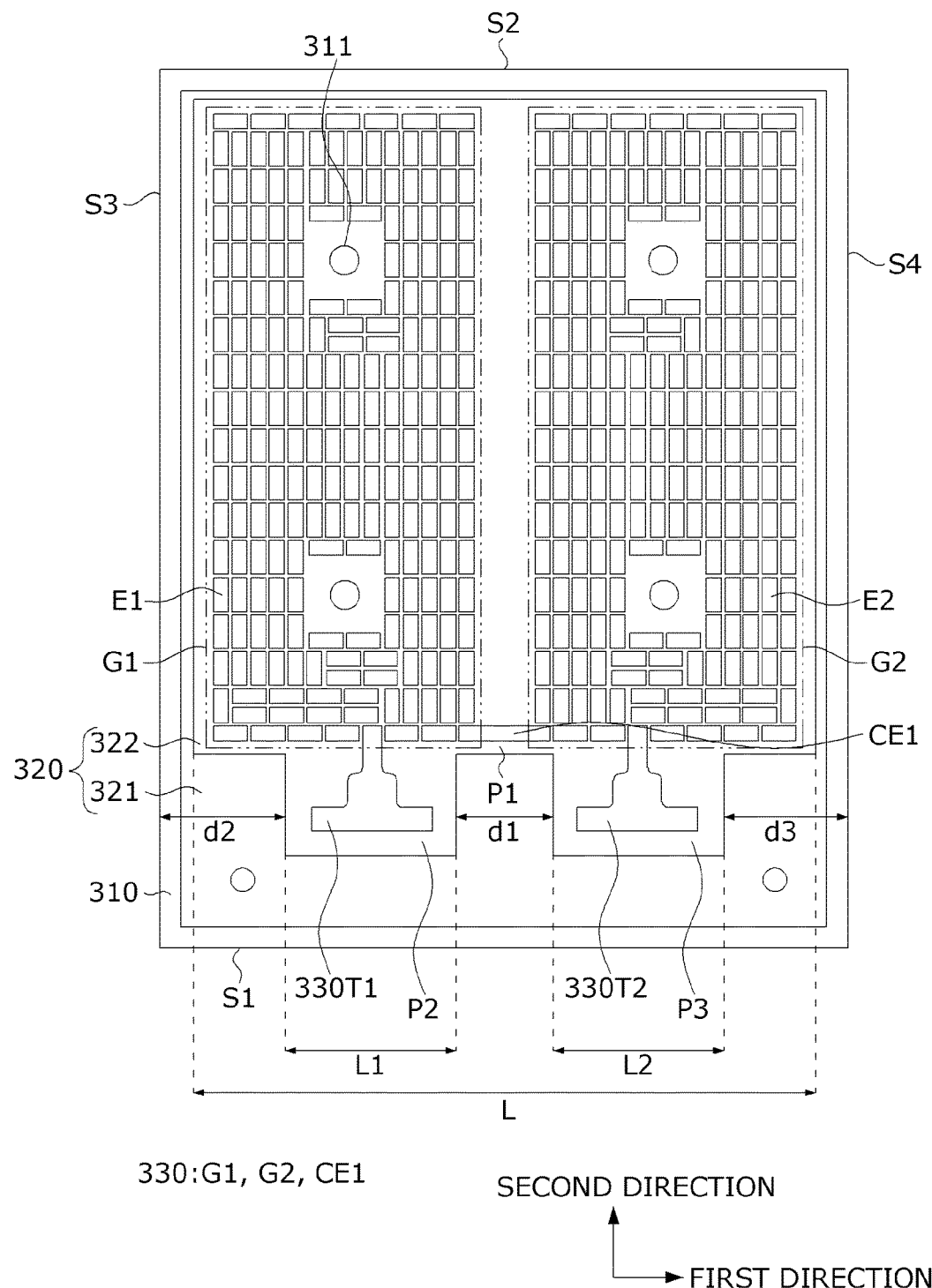

[FIG. 17]
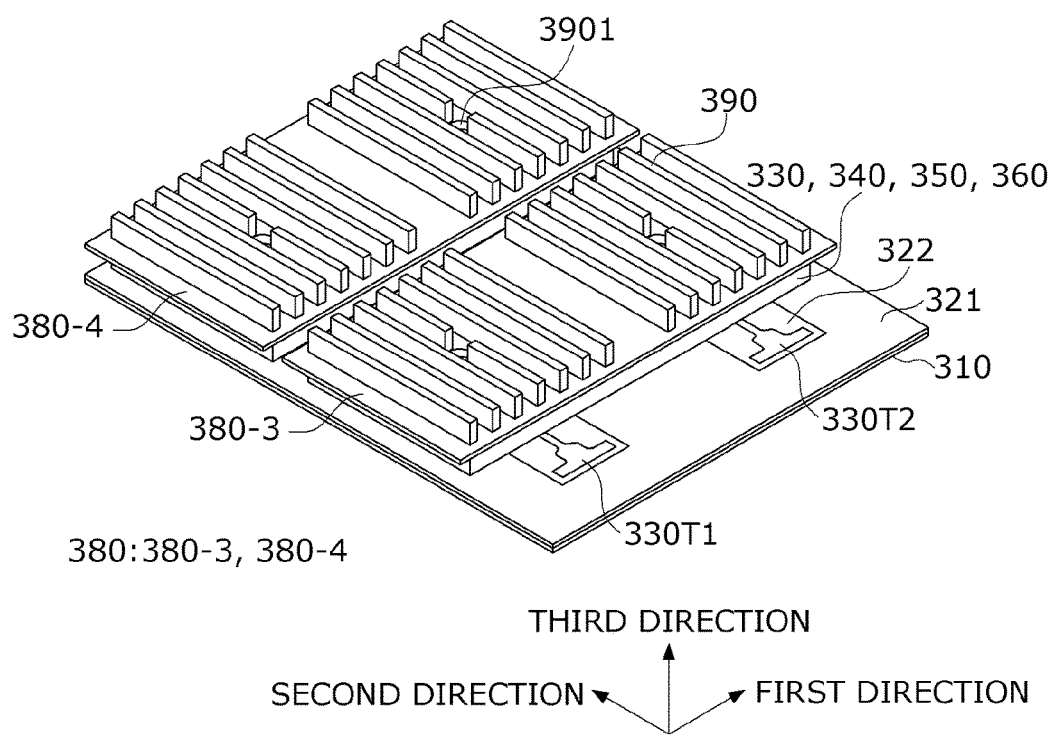

[FIG. 18]
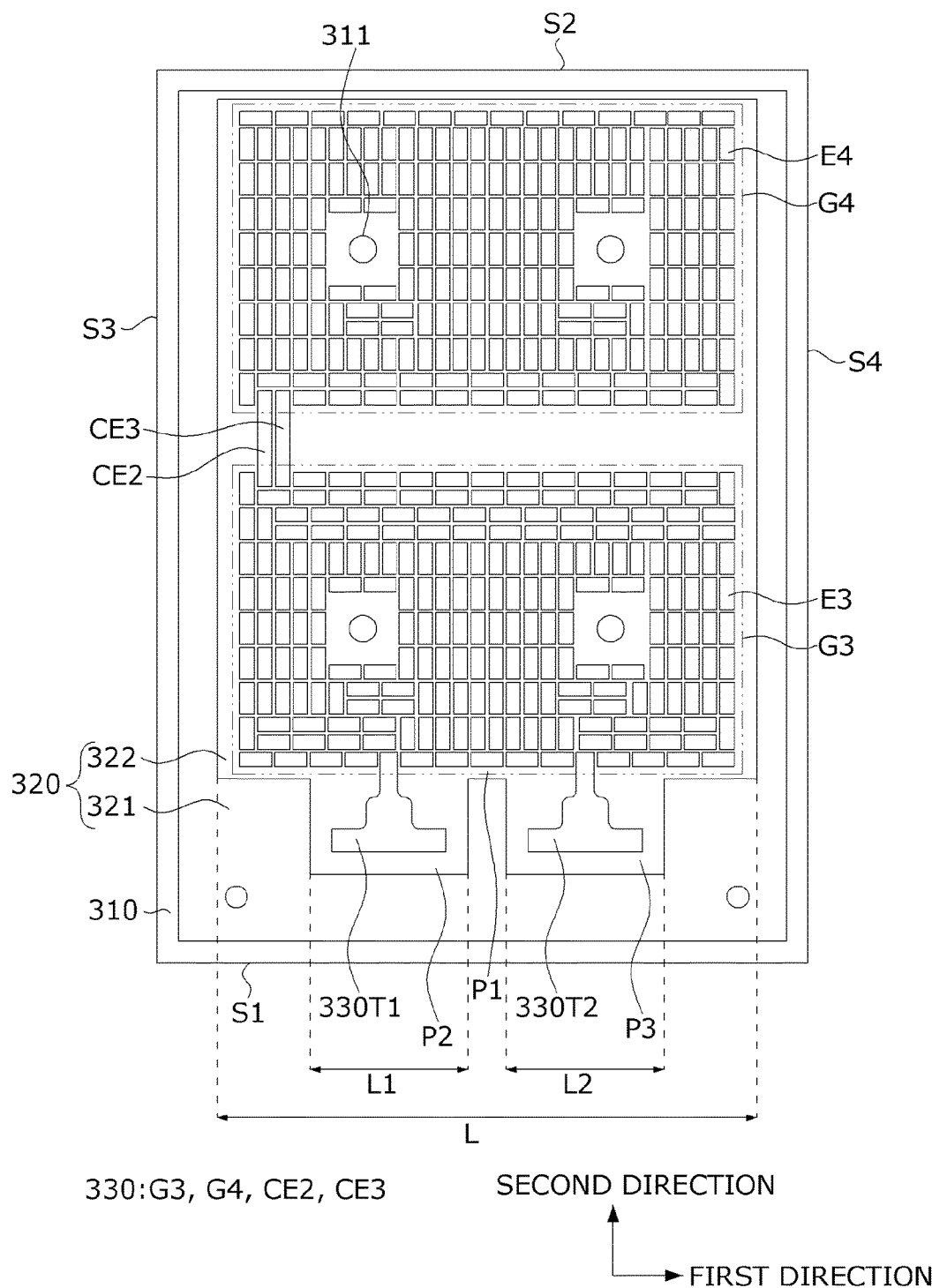

[FIG. 19]
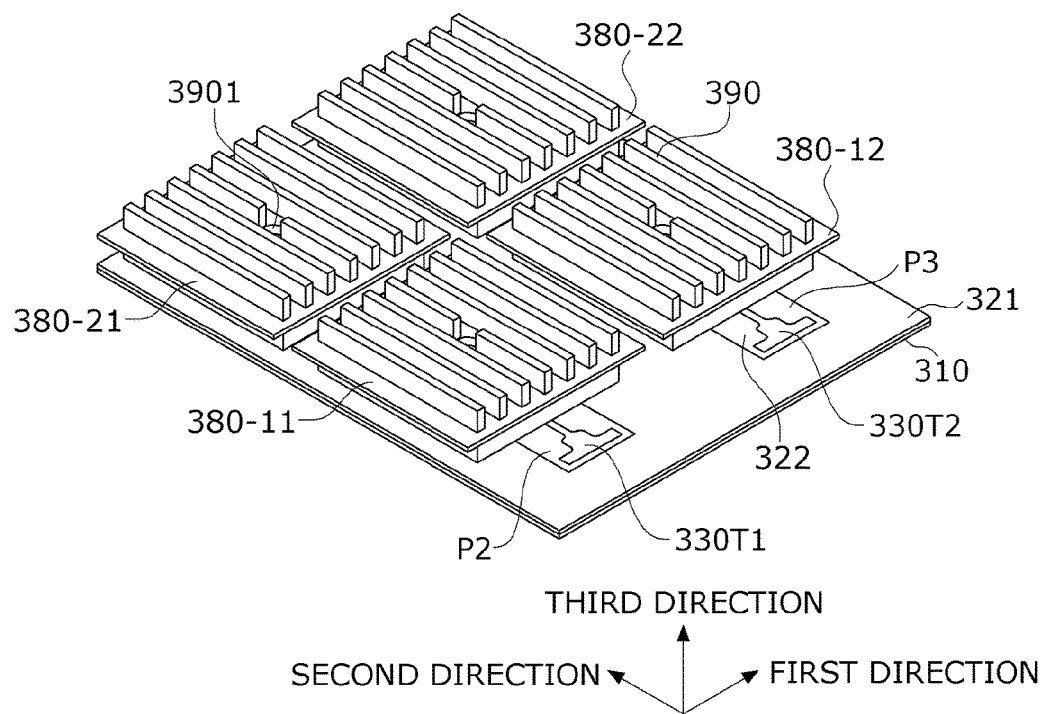

[FIG. 20]
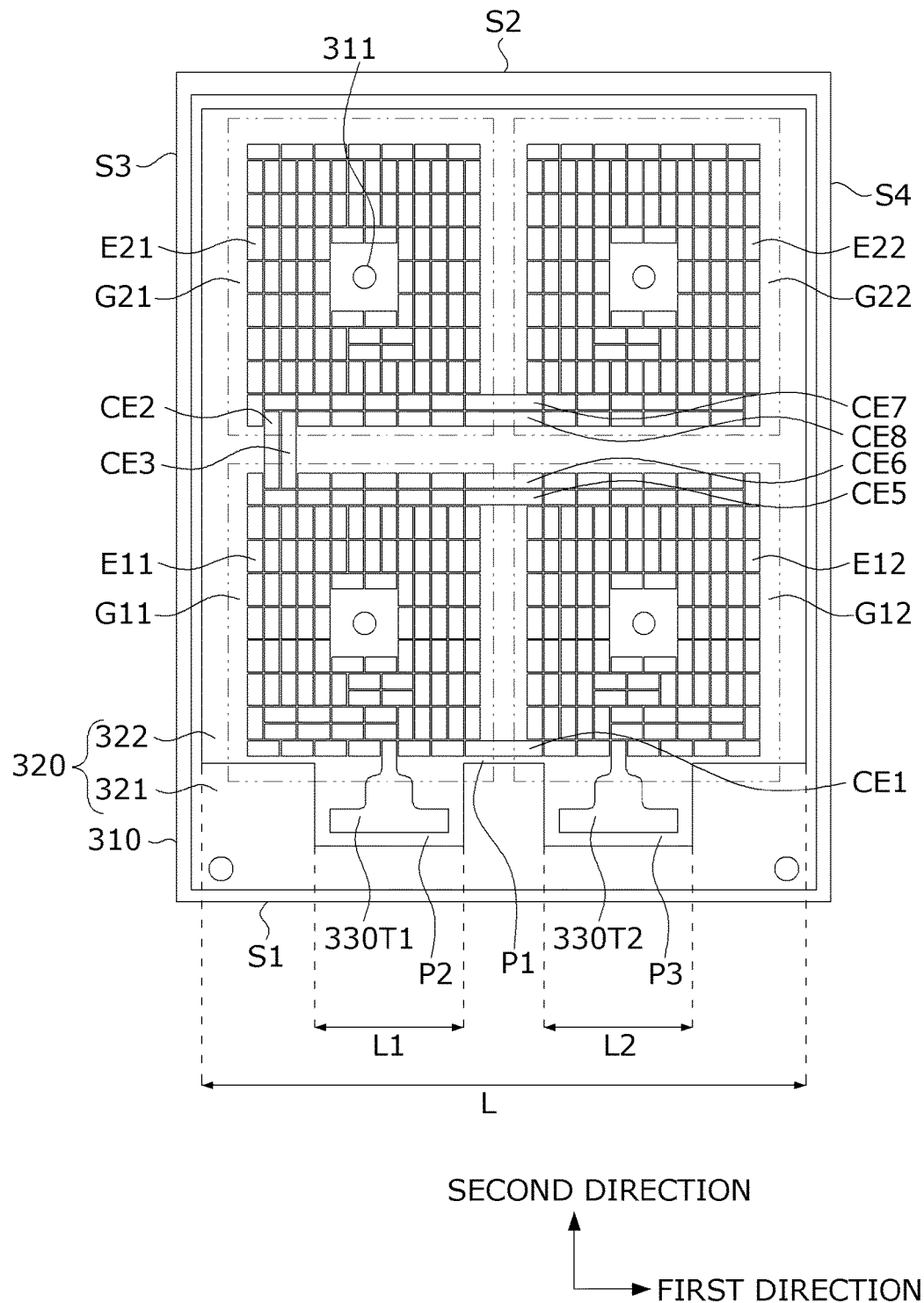

[FIG. 21]
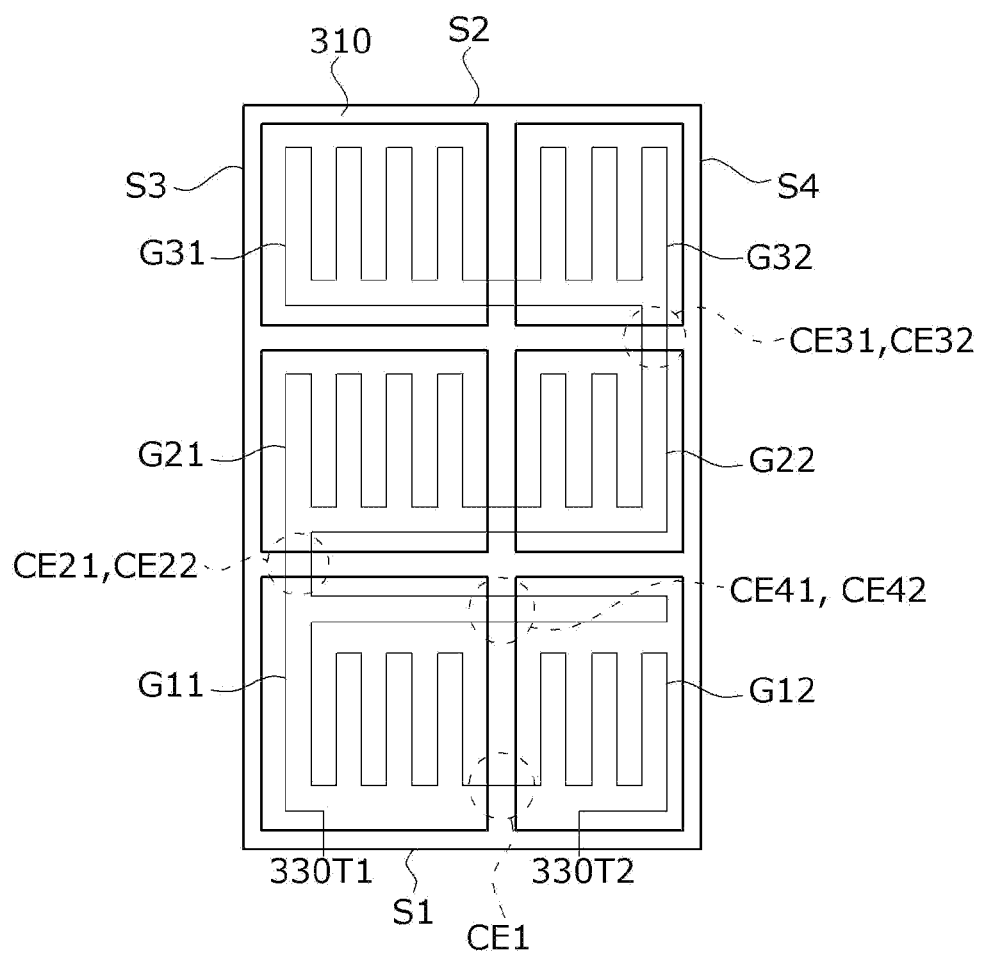

[FIG. 22]
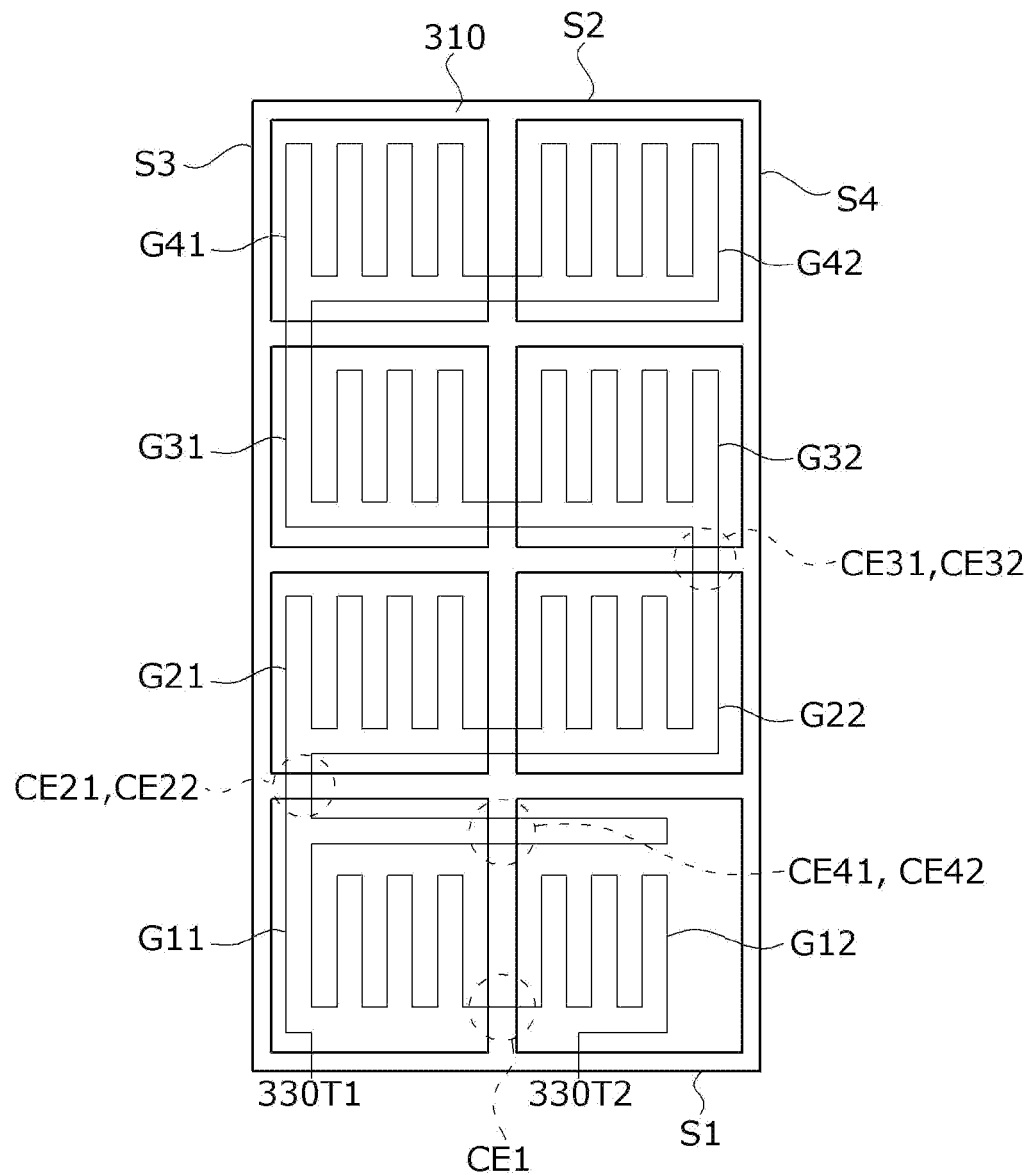

[FIG. 23]
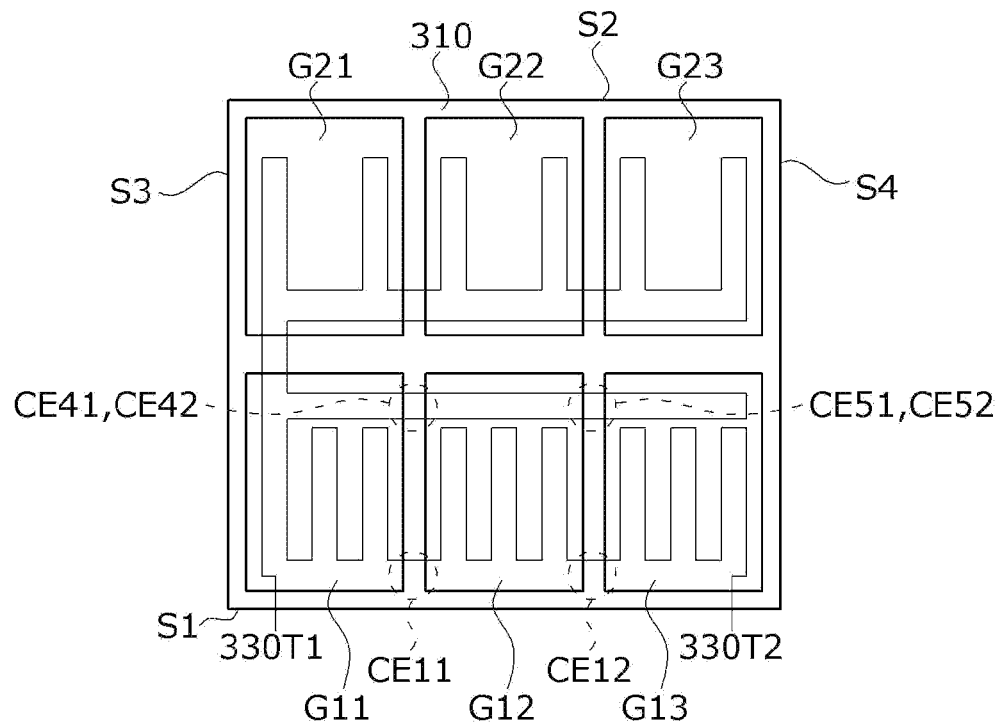
[FIG. 24]
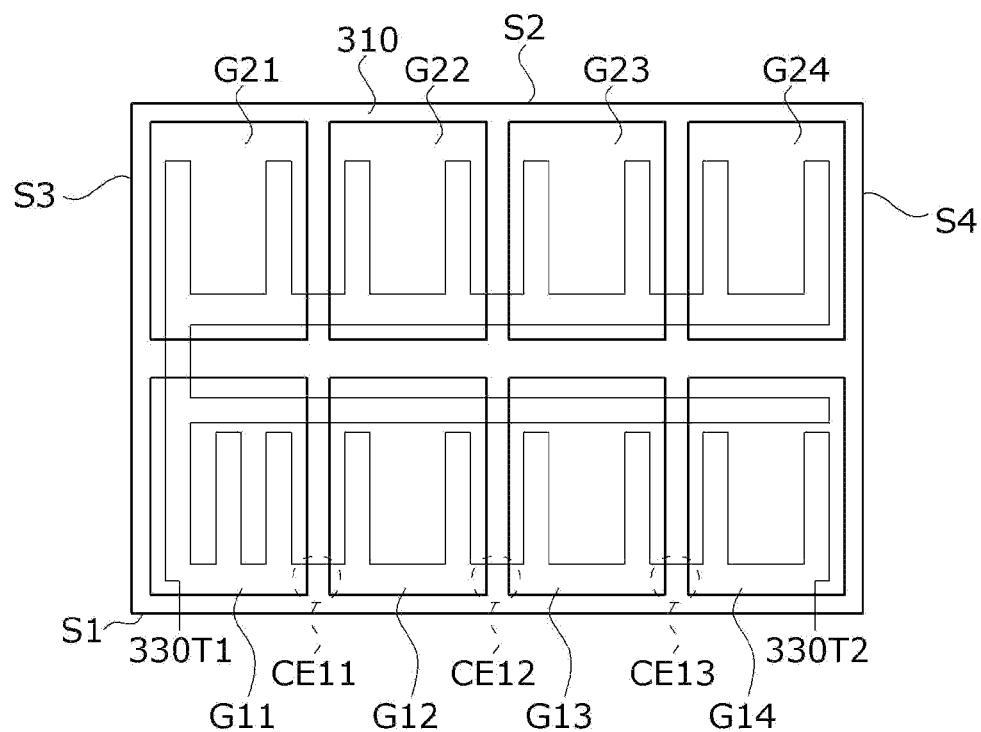

THERMOELECTRIC DEVICE

CROSS-REFERENCE TO RELATED PATENT APPLICATIONS

This application is a U.S. National Stage Application under 35 U.S.C. § 371 of PCT Application No. PCT/KR2021/009353, filed Jul. 20, 2021, which claims priority to Korean Patent Application Nos. 10-2020-0124094, filed Sep. 24, 2020, 10-2021-0091531, filed Jul. 13, 2021 and 10-2021-0095001, filed Jul. 20, 2021, whose entire disclosures are hereby incorporated by reference.

TECHNICAL FIELD

The present invention relates to a thermoelectric device, and more particularly, to a structure of an electrode unit of a thermoelectric device.

BACKGROUND ART

A thermoelectric phenomenon is a phenomenon occurring due to movement of electrons and holes in a material and means direct energy conversion between heat and electricity.

A thermoelectric device is a generic term for devices using the thermoelectric phenomenon and has a structure in which P-type thermoelectric materials and N-type thermoelectric materials are joined between metal electrodes to form PN junction pairs.

The thermoelectric devices may be classified into devices which use a temperature change of electrical resistance, devices which use the Seebeck effect in which an electromotive force is generated due to a difference in temperature, and devices which use the Peltier effect in which heat absorption or heating occurs due to a current.

The thermoelectric devices are being variously applied to home appliances, electronic components, communication components, and the like. For example, the thermoelectric devices may be applied to cooling devices, heating devices, power generation devices, and the like. Accordingly, the demand for thermoelectric performance of the thermoelectric devices is gradually increasing.

The thermoelectric device includes substrates, electrodes, and thermoelectric legs, wherein a plurality of thermoelectric legs are disposed in the form of an array between an upper substrate and a lower substrate, a plurality of upper electrodes are disposed between the upper substrate and the plurality of thermoelectric legs, and a plurality of lower electrodes are disposed between the plurality of thermoelectric legs and the lower substrate.

The thermoelectric device may be processed in a high-temperature environment due to a manufacturing process of the thermoelectric device for bonding between the substrates, the electrodes, and the thermoelectric legs. Accordingly, a warpage phenomenon may occur in the substrate, and long-term reliability, durability, and power generation performance of the thermoelectric device may be degraded due to the warpage phenomenon of the substrate.

DISCLOSURE

Technical Problem

The present invention is directed to providing a structure of an electrode unit of a thermoelectric module.

Technical Solution

A thermoelectric device according to one embodiment of the present invention includes one first substrate, an insulating layer disposed on the one first substrate, a first electrode unit disposed on the insulating layer, a first terminal electrode and a second terminal electrode which are disposed on the insulating layer and protrude toward a first outer side of the first substrate from the first electrode unit, a semiconductor structure disposed on the first electrode unit, a second electrode unit disposed on the semiconductor structure, and a second substrate unit disposed on the second electrode unit, wherein the second substrate unit includes a plurality of second substrates disposed to be spaced apart from each other, the first electrode unit includes a plurality of electrode groups vertically overlapping the plurality of second substrates, respectively, and a first connection electrode configured to connect two different electrode groups among the plurality of electrode groups, a long side of the first connection electrode is longer than a long side of a first electrode included in the plurality of electrode groups, and at least a portion of the first connection electrode is disposed not to vertically overlap the plurality of second substrates.

The first terminal electrode and the second terminal electrode may be respectively disposed in different electrode groups, and the first connection electrode may be disposed in a row closest to the first terminal electrode and the second terminal electrode in the plurality of electrode groups so as to connect the different electrode groups.

The plurality of electrode groups may include different electrode groups divided between the first outer side and a second outer side opposite to the first outer side, the first electrode unit may include two connection electrodes to connect the different electrode groups, and the two connection electrodes may be the first connection electrode and a second connection electrode disposed side by side adjacent to the first connection electrode.

The two connection electrodes may be disposed in two columns closest to an outermost column in the plurality of electrode groups.

The plurality of electrode groups may include a first electrode group, a second electrode group, and a third electrode group which are sequentially divided between the first outer side and a second outer side opposite to the first outer side, the first electrode unit may include two connection electrodes disposed to be adjacent to each other so as to connect the first electrode group and the second electrode group, and other two connection electrodes disposed to be adjacent to each other so as to connect the second electrode group and the third electrode group, the two connection electrodes may include a first connection electrode and a second connection electrode disposed side by side adjacent to the first connection electrode, and may be disposed on one side of a third outer side perpendicular to the first outer side and a fourth outer side opposite to the third outer side, and the other two connection electrodes may include a third connection electrode and a fourth connection electrode disposed side by side adjacent to the third connection electrode, and may be disposed on the other side of the third outer side and the fourth outer side.

The two connection electrodes may be disposed in two columns closest to an outermost column in the third outer side, and the other two connection electrodes may be disposed in two columns closest to an outermost column in the fourth outer side.

The plurality of electrode groups may include different electrode groups divided between a third outer side perpendicular to the first outer side and a fourth outer side opposite to the third outer side, and the first connection electrode may be disposed in an outermost row in the different electrode groups.

The first electrode unit may include two connection electrodes disposed so as to connect the different electrode groups, and the two connection electrodes may include the first connection electrode and a second connection electrode disposed side by side adjacent to the first connection electrode, and may be disposed in an outermost row in the different electrode groups and a row closest to the outermost row.

The insulating layer may include a first insulating layer disposed on the first substrate, and a second insulating layer disposed on the first insulating layer and having an area less than an area of the first insulating layer, and the second insulating layer may include an overlap region vertically overlapping the second substrate unit and a protrusion pattern protruding toward the first outer side of the first substrate from the overlap region.

The protrusion pattern may include a first protrusion pattern and a second protrusion pattern disposed to be spaced apart from each other, wherein the first terminal electrode may be disposed on the first protrusion pattern, and the second terminal electrode may be disposed on the second protrusion pattern.

The plurality of electrode groups may be disposed to be spaced apart from each other on the insulating layer, and the thermoelectric device may further include a dummy unit disposed between the plurality of electrode groups on the insulating layer.

The dummy unit may include a plurality of dummy structures each having the same shape and size as each electrode included in each of the plurality of electrode groups and disposed to be spaced apart from each other.

Each of the dummy structures may include a metal layer or a resin layer.

The plurality of electrode groups may include a first electrode group and a second electrode group which are divided between the first outer side and a second outer side opposite to the first outer side, the first electrode group may include a 1-1 electrode group and a 1-2 electrode group divided between a third outer side perpendicular to the first outer side and a fourth outer side opposite to the third outer side, the second electrode group may include a 2-1 electrode group and a 2-2 electrode group divided between the third outer side and the fourth outer side, and the dummy unit may include a first dummy unit disposed between the 1-1 electrode group and the 1-2 electrode group, a second dummy unit disposed between the 2-1 electrode group and the 2-2 electrode group, and a third dummy unit disposed between the first electrode group and the second electrode group.

The first dummy unit and the second dummy unit may be disposed to be spaced apart from each other.

A thermoelectric device according to another embodiment of the present invention includes a first substrate, a first electrode unit disposed on the first substrate and including a first electrode group and a second electrode group which are disposed to be spaced apart from each other, a second electrode unit disposed on the first electrode unit and including a third electrode group and a fourth electrode group which are disposed to be spaced apart from each other, and a semiconductor structure disposed between the first electrode unit and the second electrode unit, wherein the first electrode group and the third electrode group overlap each other in a direction perpendicular to the first substrate to form a first region, the second electrode group and the fourth electrode group overlap each other in the direction perpendicular to the first substrate to form a second region, a separation region is formed between the first region and the second region, and a dummy unit disposed in at least a portion of the separation region is included.

Each electrode group may include a plurality of electrodes disposed to be spaced apart from each other, and a separation distance between the first electrode group and the second electrode group may be greater than a separation distance between the plurality of electrodes in each electrode group.

The first electrode group and the second electrode group may be spaced apart from each other in a first direction, the first electrode group may include a 1-1 electrode group and a 1-2 electrode group spaced apart from each other in a second direction perpendicular to the first direction, and the second electrode group may include a 2-1 electrode group and a 2-2 electrode group spaced apart from each other in the second direction perpendicular to the first direction.

The dummy unit may include a first dummy unit disposed between the 1-1 electrode group and the 2-1 electrode group and a second dummy unit disposed between the 1-2 electrode group and the 2-2 electrode group.

The first dummy unit and the second dummy unit may be spaced apart from each other.

The dummy unit may further include a third dummy unit disposed between the 1-1 electrode group and the 1-2 electrode group and between the 2-1 electrode group and the 2-2 electrode group.

The first electrode unit may further include a first terminal electrode connected to the 1-1 electrode group and a second terminal electrode connected to the 2-1 electrode group.

The first electrode unit may further include a connection electrode unit configured to connect at least some of the 1-1 electrode group, the 1-2 electrode group, the 2-1 electrode group, and the 2-2 electrode group.

The connection electrode unit may include at least one of a first connection electrode disposed between the 1-1 electrode group and the 2-1 electrode group, a second connection electrode disposed between the 1-1 electrode group and the 1-2 electrode group, a third connection electrode disposed between the 1-2 electrode group and the 2-2 electrode group, and a fourth connection electrode disposed between the 2-1 electrode group and the 2-2 electrode group.

The first dummy unit and the second dummy unit may be spaced apart from each other by the first connection electrode, the third dummy unit, and the second connection electrode.

At least one of the first dummy unit, the second dummy unit, and the third dummy unit may, include a plurality of dummy structures each having the same shape and size as each electrode included in each electrode group and disposed to be spaced apart from each other.

Each of the dummy structures may include a metal layer or a resin layer.

A second substrate unit disposed on the second electrode unit may be further included, wherein the second substrate unit may include a plurality of second substrates disposed to be spaced apart from each other, and each of the second substrates may be disposed to correspond to each electrode group.

An insulator disposed in a separation region between the plurality of second substrates may be further included.

The insulator may be disposed to extend from the separation region between the plurality of second substrates to the dummy unit.

A plurality of coupling members respectively passing through a plurality of through holes each extending from the second substrate to the first substrate through each electrode group may be further included.

A plurality of heat sinks disposed on the second substrates, respectively, may be further included.

A plurality of coupling members respectively passing through a plurality of through holes each extending from each heat sink to the first substrate through each electrode group may be further included.

An insulating layer disposed between the first substrate and the first electrode unit may be further included.

The insulating layer may include a plurality of insulating layers different from each other in at least one of composition and elasticity.

Advantageous Effects

According to an embodiment of the present invention, a thermoelectric device having increased long-term reliability, durability, and power generation performance can be obtained by improving a warpage phenomenon of a substrate.

Further, according to an embodiment of the present invention, the reliability, durability, and power generation performance of a thermoelectric device can be optimized by differently designing structures of a high-temperature unit substrate and a low-temperature unit substrate.

In particular, according to an embodiment of the present invention, a problem in which a substrate is warped according to a form in which an electrode is disposed on the substrate can be prevented.

DESCRIPTION OF DRAWINGS

FIG. 1 is a cross-sectional view of a thermoelectric device.

FIG. 2 is a perspective view of the thermoelectric device.

FIG. 3 is a perspective view of the thermoelectric device including a sealing member.

FIG. 4 is an exploded perspective view of the thermoelectric device including the sealing member.

FIG. 5 is a cross-sectional view of a substrate, an insulating layer, and an electrode in the thermoelectric device.

FIG. 6 is a perspective view of a thermoelectric module according to one embodiment of the present invention.

FIG. 7 is an exploded perspective view of the thermoelectric module of FIG. 6.

FIG. 8 is a cross-sectional view of the thermoelectric module of FIG. 6.

FIG. 9 illustrates an example of a top view of a first substrate included in the thermoelectric module of FIG. 6.

FIG. 10 illustrates another example of the top view of the first substrate included in the thermoelectric module of FIG. 6.

FIG. 11 is a perspective view of a thermoelectric module according to another embodiment of the present invention.

FIG. 12 is a cross-sectional view of the thermoelectric module of FIG. 11.

FIGS. 13A and 13B illustrate a bonding structure between a heat sink and a second substrate in the thermoelectric module according to one embodiment of the present invention.

FIG. 14A is a top view of a substrate and an electrode unit of a thermoelectric device according to a comparative example.

FIG. 14B is a top view of a substrate and an electrode unit of a thermoelectric device according to Example 1.

FIG. 14C is a top view of a substrate and an electrode unit of a thermoelectric device according to Example 2.

FIG. 14D is a top view of a substrate and an electrode unit of a thermoelectric device according to Example 3.

FIG. 15 is a perspective view of a thermoelectric device according to one embodiment of the present invention.

FIG. 16 is a top view of a first substrate, an insulating layer, and a plurality of first electrodes in the embodiment of FIG. 15.

FIG. 17 is a perspective view of a thermoelectric device according to another embodiment of the present invention.

FIG. 18 is a top view of a first substrate, an insulating layer, and a plurality of first electrodes in the embodiment of FIG. 17.

FIG. 19 is a perspective view of a thermoelectric device according to still another embodiment of the present invention.

FIG. 20 is a top view of a first substrate, an insulating layer, and a plurality of first electrodes in the embodiment of FIG. 19.

FIGS. 21 to 24 are schematic views illustrating an arrangement of electrodes included in the thermoelectric device according to the embodiment of the present invention.

MODES OF THE INVENTION

Hereinafter, exemplary embodiments of the present invention will be described in detail with reference to the accompanying drawings.

However, the technical spirit of the present invention is not limited to some embodiments which will be described and may be embodied in various forms, and one or more elements in the embodiments may be selectively combined and replaced to be used within the scope of the technical spirit of the present invention.

Further, the terms used in the embodiments of the present invention (including technical and scientific terms), may be interpreted with meanings that are generally understood by those skilled in the art unless particularly defined and described, and terms which are generally used, such as terms defined in a dictionary, may be understood in consideration of their contextual meanings in the related art.

Further, the terms used in the embodiments of the present invention are provided only to describe embodiments of the present invention and not for purposes of limitation.

In the present specification, unless clearly indicated otherwise by the context, singular forms include the plural forms thereof, and in a case in which "at least one (or one or more) among A, B, and C" is described, this may include at least one combination among all combinations which can be combined with A, B, and C.

Further, terms such as first, second, A, B, (a), (b), and the like may be used to describe elements of the embodiments of the present invention.

These terms are only provided to distinguish the elements from other elements, and the essence, sequence, order, or the like of the elements are not limited by the terms.

In addition, when an element is described as being "connected," "coupled," or "linked" to another element, the element may include not only a case of being directly connected, coupled, or linked to another element but also a case of being connected, coupled, or linked to another element by still another element between the element and another element.

Further, when an element is described as being formed "on (above)" or "under (below)" another element, the term "on (above)" or "under (below)" includes both of a case in which two elements are in direct contact with each other or a case in which one or more elements are (indirect contact) disposed between two elements. In addition, when an element is described as being disposed "on or under" another element, such a description may include a case in which the element is disposed at an upper side or a lower side with respect to another element.

FIG. 1 is a cross-sectional view of a thermoelectric device, and FIG. 2 is a perspective view of the thermoelectric device. FIG. 3 is a perspective view of the thermoelectric device including a sealing member, and FIG. 4 is an exploded perspective view of the thermoelectric device including the sealing member. FIG. 5 is a cross-sectional view of a substrate, an insulating layer, and an electrode in the thermoelectric device.

Referring to FIGS. 1 and 2, a thermoelectric device 100 includes a lower substrate 110, lower electrodes 120, P-type thermoelectric legs 130, N-type thermoelectric legs 140, upper electrodes 150, and an upper substrate 160.

The lower electrodes 120 are disposed between the lower substrate 110 and lower bottom surfaces of the P-type thermoelectric legs 130 and the N-type thermoelectric legs 140, and the upper electrodes 150 are disposed between the upper substrate 160 and upper surfaces of the P-type thermoelectric legs 130 and the N-type thermoelectric legs 140. Accordingly, a plurality of P-type thermoelectric legs 130 and a plurality of N-type thermoelectric legs 140 are electrically connected by the lower electrodes 120 and the upper electrodes 150. A pair of the P-type thermoelectric leg 130 and the N-type thermoelectric leg 140, which are disposed between the lower electrode 120 and the upper electrode 150 and electrically connected to each other, may form a unit cell.

For example, when a voltage is applied between the lower electrode 120 and the upper electrode 150 through lead lines 181 and 182, due to the Peltier effect, the substrate through which a current flows from the P-type thermoelectric leg 130 to the N-type thermoelectric leg 140 may absorb heat and thus serve as a cooling unit, and the substrate through which a current flows from the N-type thermoelectric leg 140 to the P-type thermoelectric leg 130 may be heated and thus serve as a heating unit. Alternatively, when a temperature difference is provided between the lower electrode 120 and the upper electrode 150, due to the Seebeck effect, charges in the P-type thermoelectric leg 130 and the N-type thermoelectric leg 140 move, and thus electricity may be produced.

Although the lead lines 181 and 182 are illustrated as being disposed on the lower substrate 110 in FIGS. 1 to 4, the present invention is not limited thereto, and the lead lines 181 and 182 may be disposed on the upper substrate 160, or one of the lead lines 181 and 182 may be disposed on the lower substrate 110 and the other may be disposed on the upper substrate 160.

Here, the P-type thermoelectric leg 130 and the N-type thermoelectric leg 140 may be bismuth-telluride (Bi—Te)-based thermoelectric legs including bismuth (Bi) and tellurium (Te) as main raw materials. The P-type thermoelectric leg 130 may be a Bi—Te-based thermoelectric leg including at least one among antimony (Sb), nickel (Ni), aluminum (Al), copper (Cu), silver (Ag), lead (Pb), boron (B), gallium (Ga), tellurium (Te), bismuth (Bi), and indium (In). For example, the P-type thermoelectric leg 130 may include a Bi—Sb—Te-based main raw material in an amount of 99 to 99.999 wt % and a material containing at least one among nickel (Ni), aluminum (Al), copper (Cu), silver (Ag), lead (Pb), boron (B), gallium (Ga), and indium (In) in an amount of 0.001 to 1 wt % based on the total weight of 100 wt %. The N-type thermoelectric leg 140 may be a Bi—Te-based thermoelectric leg including at least one among selenium (Se), nickel (Ni), aluminum (Al), copper (Cu), silver (Ag), lead (Pb), boron (B), gallium (Ga), tellurium (Te), bismuth (Bi), and indium (In). For example, the N-type thermoelectric leg 140 may include a Bi—Se—Te-based main raw material in an amount of 99 to 99.999 wt % and a material containing at least one among nickel (Ni), aluminum (Al), copper (Cu), silver (Ag), lead (Pb), boron (B), gallium (Ga), and indium (In) in an amount of 0.001 to 1 wt % based on the total weight of 100 wt %. Accordingly, in the present specification, the thermoelectric leg may be referred to as a semiconductor structure, a semiconductor device, a semiconductor substance layer, a semiconductor material layer, a conductive semiconductor structure, a thermoelectric structure, a thermoelectric substance layer, a thermoelectric material layer, or the like.

The P-type thermoelectric leg 130 and the N-type thermoelectric leg 140 may be formed in a bulk type or a stacked type. In general, the bulk type P-type thermoelectric leg 130 or the bulk type N-type thermoelectric leg 140 may be obtained through a process of performing a thermal process on a thermoelectric material to manufacture an ingot, pulverizing and sieving the ingot to obtain powder for a thermoelectric leg, sintering the powder, and cutting a sintered body. Here, the P-type thermoelectric leg 130 and the N-type thermoelectric leg 140 may be polycrystalline thermoelectric legs. As described above, when the P-type thermoelectric leg 130 and the N-type thermoelectric leg 140 are polycrystalline thermoelectric legs, the strength of each of the P-type thermoelectric leg 130 and the N-type thermoelectric leg 140 may be increased. The stacked type P-type thermoelectric leg 130 or the stacked type N-type thermoelectric leg 140 may be obtained through a process of coating a sheet-shaped base with a paste including a thermoelectric material to form unit members, stacking the unit members, and cutting the stacked unit members.

Here, the pair of P-type thermoelectric leg 130 and N-type thermoelectric leg 140 may have the same shape and volume or may have different shapes and volumes. For example, since electrical conduction properties of the P-type thermoelectric leg 130 and the N-type thermoelectric leg 140 are different, a height or sectional area of the N-type thermoelectric leg 140 may be formed to be different from that of the P-type thermoelectric leg 130.

Here, the P-type thermoelectric leg 130 or the N-type thermoelectric leg 140 may have a cylindrical shape, a polygonal columnar shape, an elliptical columnar shape, or the like.

Alternatively, the P-type thermoelectric leg 130 or the N-type thermoelectric leg 140 may have a stacked type structure. For example, the P-type thermoelectric leg or the N-type thermoelectric leg may be formed by a method of stacking a plurality of structures each having a sheet-shaped base coated with a semiconductor material and then cutting the plurality of structures. Thus, it is possible to prevent the loss of a material and improve electrical conduction properties. Each of the structures may further include a conductive layer having an opening pattern, thereby increasing adhesion between the structures, lowering thermal conductivity, and increasing electrical conductivity.

Alternatively, the P-type thermoelectric leg 130 or the N-type thermoelectric leg 140 may be formed such that sectional areas thereof are different within one thermoelectric leg. For example, in one thermoelectric leg, sectional areas of both end portions each disposed to face the electrode may be formed to be greater than a sectional area between the both end portions. Accordingly, a great temperature difference may be formed between the both end portions, and thus thermoelectric efficiency may be increased.

The performance of the thermoelectric device according to one embodiment of the present invention may be expressed as a thermoelectric figure-of-merit (ZT) The thermoelectric figure-of-merit (ZT) may be expressed as in Equation 1, $$ZT = \alpha^2 \cdot \sigma \cdot T/k \qquad \text{[Equation 1]}$$

where α denotes the Seebeck coefficient [V/K], σ denotes electrical conductivity [S/m], and $\alpha^2\sigma$ denotes a power factor [W/mK²]. In addition, T denotes temperature, and k denotes thermal conductivity [W/mK]. k may be expressed as a·cp·ρ, wherein a denotes thermal diffusivity [cm²/S], cp denotes specific heat [J/gK], and ρ denotes density [g/cm³].

In order to obtain the thermoelectric figure-of-merit of the thermoelectric device, a Z value [V/K] is measured using a Z meter, and the thermoelectric figure-of-merit (ZT) may be calculated using the measured Z value.

Here, each of the lower electrodes 120, which are disposed between the lower substrate 110 and the P-type thermoelectric leg 130 and the N-type thermoelectric leg 140, and the upper electrodes 150, which are disposed between the upper substrate 160 and the P-type thermoelectric leg 130 and the N-type thermoelectric leg 140, may include at least one among copper (Cu), silver (Ag), aluminum (Al), and nickel (Ni), and have a thickness of 0.01 mm to 0.3 mm. When the thickness of the lower electrode 120 or the upper electrode 150 is less than 0.01 mm, the function as an electrode of the lower electrode 120 or the upper electrode 150 may be deteriorated and thus electrical conduction performance may be lowered, and when the thickness of the lower electrode 120 or the upper electrode 150 is greater than 0.3 mm, the conduction efficiency may be lowered due to an increase in resistance.

In addition, the lower substrate 110 and the upper substrate 160 opposite to each other may be metal substrates, and a thickness of the metal substrate may range from 0.1 mm to 1.5 mm. When the thickness of the metal substrate is less than 0.1 mm or greater than 1.5 mm, heat radiation characteristics or thermal conductivity may be excessively high, and thus the reliability of the thermoelectric device may be lowered. In addition, when the lower substrate 110 and the upper substrate 160 are metal substrates, an insulating layer 170 may be further formed between the lower substrate 110 and the lower electrodes 120 and between the upper substrate 160 and the upper electrodes 150. The insulating layer 170 may include a material having a thermal conductivity of 1 to 20 W/mK.

In this case, the lower substrate 110 and the upper substrate 160 may be formed to have different sizes. For example, a volume, a thickness, or an area of one of the lower substrate 110 and the upper substrate 160 may be formed to be greater than that of the other. Accordingly, it is possible to increase the heat absorption performance or heat dissipation performance of the thermoelectric device. For example, at least one of a volume, a thickness, and an area of a substrate disposed in a high temperature region for the Seebeck effect, applied as a heating region for the Peltier effect, or on which a sealing member for protecting the thermoelectric module from the external environment is disposed, may be greater than at least one of a volume, a thickness, and an area of the other substrate.

In addition, a heat dissipation pattern, for example, a concavo-convex pattern, may also be formed on a surface of at least one of the lower substrate 110 and the upper substrate 160. Accordingly, the heat dissipation performance of the thermoelectric device may be increased. In a case in which the concavo-convex pattern is formed on a surface in contact with the P-type thermoelectric leg 130 or the N-type thermoelectric leg 140, a bonding property between the thermoelectric leg and the substrate may also be improved. The thermoelectric device 100 includes the lower substrate 110, the lower electrodes 120, the P-type thermoelectric legs 130, the N-type thermoelectric legs 140, the upper electrodes 150, and the upper substrate 160.

As illustrated in FIGS. 3 and 4, a sealing member 190 may be further disposed between the lower substrate 110 and the upper substrate 160. The sealing member 190 may be disposed on side surfaces of the lower electrode 120, the P-type thermoelectric leg 130, the N-type thermoelectric leg 140, and the upper electrode 150 between the lower substrate 110 and the upper substrate 160. Accordingly, the lower electrode 120, the P-type thermoelectric leg 130, the N-type thermoelectric leg 140, and the upper electrode 150 may be sealed from external moisture, heat, contamination, and the like. Here, the sealing member 190 may include a sealing case 192 disposed a predetermined distance from the outermost side of the plurality of lower electrodes 120, the outermost side of the plurality of P-type thermoelectric legs 130 and the plurality of N-type thermoelectric legs 140, and the outermost side of the plurality of upper electrodes 150, a sealing material 194 disposed between the sealing case 192 and the lower substrate 110, and a sealing material 196 disposed between the sealing case 192 and the upper substrate 160. As described above, the sealing case 192 may be in contact with the lower substrate 110 and the upper substrate 160 through the sealing materials 194 and 196. Accordingly, a problem may be prevented in which thermal conduction occurs through the sealing case 192 when the sealing case 192 is in direct contact with the lower substrate 110 and the upper substrate 160, and as a result, the temperature difference between the lower substrate 110 and the upper substrate 160 is lowered. Here, the sealing materials 194 and 196 may include at least one of an epoxy resin and a silicone resin or may include a tape in which at least one of an epoxy resin and a silicone resin is applied on both surfaces. The sealing materials 194 and 194 may serve to hermetically seal between the sealing case 192 and the lower substrate 110 and between the sealing case 192 and the upper substrate 160, may improve the effect of sealing the lower electrodes 120, the P-type thermoelectric legs 130, the N-type thermoelectric legs 140, and the upper electrodes 150, and may be used interchangeably with a finishing material, a finishing layer, a waterproof material, a waterproof layer, and the like. Here, the sealing material 194 that seals between the sealing case 192 and the lower substrate 110 may be disposed on an upper surface of the lower substrate 110, and the sealing material 196 that seals between the sealing case 192 and the upper substrate 160 may be disposed on side surfaces of the upper substrate 160. Meanwhile, guide grooves G for leading the lead lines 181 and 182 connected to the electrodes may be formed in the sealing case 192. To this end, the sealing case 192 may be an injection molded product made of plastic or the like and may be used interchangeably with a sealing cover. However, the above description of the sealing member is merely exemplary, and the sealing member may be modified in various forms. Although not shown in the drawing, a heat-insulating material may be further included to surround the sealing member. Alternatively, the sealing member may include a heat-insulating component.

Although the terms the "lower substrate 110," the "lower electrode 120," the "upper electrode 150," and the "upper substrate 160" are used in the above, they are arbitrarily referred to as "upper portion" and "lower portion" for ease of understanding and convenience of description, and thus it is understood that the positions may be reversed such that the lower substrate 110 and the lower electrode 120 are disposed on the upper side and the upper electrode 150 and the upper substrate 160 may be disposed on the lower side.

In the present specification, the lower substrate 110 may be interchangeably used with a first substrate 110 or a first substrate unit 110, and the upper substrate 160 may be interchangeably used with a second substrate 160 or a second substrate unit 160. Similarly, the lower electrode 120 may be interchangeably used with a first electrode 120 or a first electrode unit 120, and the upper electrode 150 may be interchangeably used with a second electrode 150 or a second electrode unit 150.

Meanwhile, as described above, in order to improve the thermal conduction performance of the thermoelectric device, attempts to use a metal substrate are increasing. However, when the thermoelectric device includes a metal substrate, an advantageous effect may be obtained in terms of thermal conduction, but there is a problem in that a withstand voltage is lowered. In particular, when the thermoelectric device is applied under a high-voltage environment, a withstand voltage performance of 2.5 kV or more is required. In order to improve the withstand voltage performance of the thermoelectric device, a plurality of insulating layers having different compositions may be disposed between the metal substrate and the electrode.

Referring to FIG. 5, the insulating layer 170 may include a first insulating layer 172 disposed on the first substrate 110 and a second insulating layer 174 disposed on the first insulating layer 172, and the first electrode 120 may be disposed on the second insulating layer 174. For convenience of description, the insulating layer on the first substrate 110 side is mainly described, but the same content may also be applied to the insulating layer on the second substrate 160 side.

At this point, the first insulating layer 172 may include a resin material as an example, and may include a composite including silicon and aluminum and an inorganic filler. Here, the composite may be an organic/inorganic composite composed of an inorganic material including an Si element and an Al element and an alkyl chain, and may be at least one of an oxide, a carbide, and a nitride including silicon and aluminum. For example, the composite may include at least one among an Al—Si bond, an Al—O—Si bond, a Si—O bond, an Al—Si—O bond, and an Al—O bond. The composite including at least one among the Al—Si bond, the Al—O—Si bond, the Si—O bond, the Al—Si—O bond, and the Al—O bond as described above has excellent insulating performance and thus may achieve high withstand voltage performance. Alternatively, the composite may be an oxide, a carbide, or a nitride further including titanium, zirconium, boron, zinc, and the like together with silicon and aluminum. To this end, the composite may be obtained through a process of mixing aluminum with at least one of an inorganic binder and an organic-inorganic mixed binder and then heat-treating. The inorganic binder may include at least one among, for example, silica ($SiO_2$), metal alkoxide, boron oxide ($B_2O_3$), and zinc oxide ($ZnO_2$). The inorganic binder may include inorganic particles and may act as a binder by being solated or gelled when coming into contact with water. In this case, at least one of the silica ($SiO_2$), the metal alkoxide, and the boron oxide ($B_2O_3$) may serve to increase the adhesion between aluminum, or the adhesion to the first substrate 110, and the zinc oxide ($ZnO_2$) may serve to increase the strength of the first insulating layer 172 and increase the thermal conductivity. The inorganic filler may be dispersed in the composite and may include at least one of aluminum oxide and nitride. Here, the nitride may include at least one of boron nitride and aluminum nitride.

Meanwhile, the second insulating layer 174 may be formed of a resin layer including at least one of an epoxy resin composition containing an epoxy resin and an inorganic filler and a silicone resin composition containing polydimethylsiloxane (PDMS). Accordingly, the second insulating layer 174 may improve an insulation property, a bonding force, and thermal conduction performance between the first insulating layer 172 and the first electrode 120.

Here, the inorganic filler may be included in an amount of 60 to 80 wt % of the resin layer. When the inorganic filler is included at less than 60 wt %, the thermal conduction effect may be reduced, and when the inorganic filler is included at more than 80 wt %, the inorganic filler may be difficult to uniformly disperse in the resin, and the resin layer may be easily broken.

In addition, the epoxy resin may include an epoxy compound and a curing agent. In this case, the curing agent may be included in a volume ratio of 1 to 10 based on a volume ratio of 10 of the epoxy compound. Here, the epoxy compound may include at least one among a crystalline epoxy compound, an amorphous epoxy compound, and a silicone epoxy compound. The inorganic filler may include at least one of aluminum oxide and nitride. Here, the nitrides may include at least one of boron nitride and aluminum nitride.

Meanwhile, the second insulating layer 174 may be formed through a method of coating the first insulating layer 172 with a resin composition in a non-cured state or a semi-cured state and then disposing a plurality of pre-aligned first electrodes 120 followed by pressurizing and curing the first electrodes 120. Accordingly, some of side surfaces of the plurality of first electrodes 120 may be buried in the second insulating layer 172. In this case, a height H1 of each of the side surfaces of the plurality of first electrodes 120 buried in the second insulating layer 174 may be 0.1 to 1.0 times, preferably 0.2 to 0.9 times, and more preferably 0.3 to 0.8 times a thickness H of each of the plurality of first electrodes 330. As described above, when some of the side surfaces of the plurality of first electrodes 120 are buried in the second insulating layer 174, a contact area between the plurality of first electrodes 120 and the second insulating layer 174 is widened, and thus the heat transfer performance and the bonding strength between the plurality of first electrodes 120 and the second insulating layer 174 may be further increased. When the height H1 of the side surfaces of the plurality of first electrodes 120 buried in the second insulating layer 174 is less than 0.1 times the thickness H of the plurality of first electrodes 120, it may be difficult to obtain sufficient heat transfer performance and bonding strength between the plurality of first electrodes 120 and the second insulating layer 174, and when the height H1 of the side surfaces of the plurality of first electrodes 120 buried in the second insulating layer 174 exceeds 1.0 times the thickness H of the plurality of first electrodes 120, the second insulating layer 174 may rise over the plurality of first electrodes 120 and thus there is a possibility of an electrical short circuit.

As such, an upper surface of the second insulating layer 174 may include a first concave surface R1 and a second concave surface R2 disposed around the first concave surface R1. Each of the plurality of first electrodes 120 may be disposed on the first concave surface R1, and a first vertical distance between the first concave surface R1 and the first substrate 110 may be less than a second vertical distance between the second concave surface R2 and the first substrate 110. More specifically, a thickness of the second insulating layer 174 between the plurality of first electrodes 120 decreases from the side surface of each electrode toward a central region of the second insulating layer 174 to have a V-shape with a gentle vertex. Accordingly, the insulating layer 170 between the plurality of first electrodes 120 has a variation in thickness, and a height D2 of a region in direct contact with the side surfaces of the plurality of first electrodes 120 is greatest and a height D3 of the central region may be less than the height D2 of the region in direct contact with the side surfaces of the plurality of first electrodes 120. That is, the height D3 of the central region of the insulating layer 170 between the plurality of first electrodes 120 may be smallest in the insulating layer 170 between the plurality of first electrodes 120. In addition, a height D1 of the insulating layer 170 below the plurality of first electrodes 120 may be less than the height D3 of the central region of the insulating layer 170 between the plurality of first electrodes 120. As the second insulating layer 174 includes the second concave surface R2, stress applied to the insulating layer can be mitigated, so that problems such as cracking or peeling of the insulating layer may be avoided.

Meanwhile, the first insulating layer 172 and the second insulating layer 174 may have different compositions, and thus at least one of hardness, elastic modulus, tensile strength, elongation, and Young's modulus may vary between the first insulating layer 172 and the second insulating layer 174, and accordingly, it is possible to control withstand voltage performance, thermal conduction performance, bonding performance, thermal shock mitigation performance, and the like. For example, a weight ratio of the composite and the inorganic filler to the entire first insulating layer 172 may be greater than a weight ratio of the inorganic filler to the entire second insulating layer 174. As described above, the composite may be a composite including silicon and aluminum, and more specifically, a composite including at least one of an oxide, a carbide, and a nitride containing silicon and aluminum. For example, the weight ratio of the ceramic, that is, the composite and the inorganic filler, to the entire first insulating layer 172 may be greater than 80 wt %, and the weight ratio of the ceramic, that is, the inorganic filler, to the entire second insulating layer 174 may be in a range of 60 to 80 wt %. As described above, when the content of the composite and the inorganic filler included in the first insulating layer 172 is greater than the content of the inorganic filler included in the second insulating layer 174, the hardness of the first insulating layer 172 may be higher than that of the second insulating layer 174. Accordingly, the first insulating layer 172 may simultaneously have high withstand voltage performance and high thermal conduction performance, the second insulating layer 174 may have higher elasticity than the first insulating layer 172, and the second insulating layer 174 may increase bonding performance between the first insulating layer 172 and the first electrode 120. Here, the elasticity may be expressed as tensile strength. For example, a tensile strength of the second insulating layer 174 may be in a range of 2 to 5 MPa, preferably 2.5 to 4.5 MPa, and more preferably 3 to 4 MPa, and a tensile strength of the first insulating layer 172 may be in a range of 10 MPa to 100 MPa, preferably 15 MPa to 90 MPa, and more preferably 20 MPa to 80 MPa.

In this case, the thickness of the second insulating layer 174 may be greater than 1 times and less than or equal to 3.5 times the thickness of the first insulating layer 172, preferably 1.05 to 2 times the thickness of the first insulating layer 172, and more preferably 1.1 to 1.5 times the thickness of the first insulating layer 172. For example, the thickness of the first insulating layer 172 may be 35 μm or less, and the thickness of the second insulating layer 174 may be greater than 35 μm and less than or equal to 80 μm, preferably greater than 35 μm and less than or equal to 70 μm, and more preferably greater than 35 μm and less than or equal to 50 μm.

When the thickness of the first insulating layer 172 and the thickness of the second insulating layer 174 satisfy the above numerical ranges, it is possible to simultaneously obtain the withstand voltage performance, the thermal conduction performance, the bonding performance, and the thermal shock mitigation performance.

Further, a width of the first concave surface R1 may be disposed to be greater than a width of the second concave surface R2. Accordingly, a structure in which electrodes are densely disposed on a substrate may be achieved, and thus power generation performance or temperature control performance of the thermoelectric device may be improved.

Further, a thermal expansion coefficient of the second insulating layer 174 may be greater than that of the first insulating layer 172. Accordingly, a substrate warpage phenomenon may be improved.

FIG. 6 is a perspective view of a thermoelectric module according to one embodiment of the present invention, FIG. 7 is an exploded perspective view of the thermoelectric module of FIG. 6, FIG. 8 is a cross-sectional view of the thermoelectric module of FIG. 6, FIG. 9 is an example of a top view of a first substrate included in the thermoelectric module of FIG. 6, and FIG. 10 is another example of the top view of the first substrate included in the thermoelectric module of FIG. 6.

Referring to FIGS. 6 to 9, a thermoelectric device 300 according to one embodiment of the present invention includes a first substrate 310, a first insulating layer 320 disposed on the first substrate 310, a first electrode unit 330 disposed on the first insulating layer 320, a plurality of P-type thermoelectric legs 340 and a plurality of N-type thermoelectric legs 350 disposed on a plurality of first electrodes 330, a second electrode unit 360 disposed on the plurality of P-type thermoelectric legs 340 and the plurality of N-type thermoelectric legs 350, a second insulating layer 370 disposed on the second electrode unit 360, a second substrate unit 380 disposed on the second insulating layer 370, and a heat sink 390 disposed on the second substrate unit 380. For the contents of the first substrate 310, the first electrode unit 330, the P-type thermoelectric legs 340, the N-type thermoelectric legs 350, the second electrode unit 360, and the second substrate unit 380, which are respectively the same as those of the first substrate 110, the first electrode 120, the P-type thermoelectric legs 130, the N-type thermoelectric legs 140, the second electrode 150, and the second substrate 160 of FIGS. 1 to 4, repeated descriptions will be omitted. In addition, for the contents the first insulating layer 320 and the second insulating layer 370, which are the same as those of the insulating layer 170 of FIGS. 1 to 5, repeated descriptions will be omitted. Although not illustrated in FIGS. 6 to 8, a sealing member may be further disposed between the first substrate 310 and the second substrate unit 380.

According to the embodiment of the present invention, the second substrate unit 380 may include a plurality of second substrates 381, 382, 383, and 384 disposed to be spaced apart from each other, and a through hole through which a coupling member 400 passes may be formed in the first substrate 310 and each of the second substrates 381, 382, 383, and 384 included in the second substrate unit 380.

The first substrate 310 may be formed in a plate shape, and although not shown in the drawings, the first substrate may be disposed on a cooling unit or a heating unit. In order to fix the thermoelectric module 300 according to the embodiment of the present invention onto the cooling unit or the heating unit, a groove or hole into which the coupling member 400 may be inserted may be formed in a cooling unit C or the heating unit.

The first substrate 310 and the plurality of second substrates 381, 382, 383, and 384 included in the second substrate unit 380 may each include at least one among aluminum, an aluminum alloy, copper, and a copper alloy. Here, when a voltage is applied to the thermoelectric module, the first substrate 310 may absorb heat according to the Peltier effect and act as a low-temperature unit, and the second substrate unit 380 may emit heat and act as a high-temperature unit. Meanwhile, when different temperatures are applied to the first substrate 310 and the second substrate unit 380, a thermoelectromotive force is generated while electrons in a high-temperature region move to a low-temperature region due to the temperature difference. This is called the Seebeck effect, and electricity may be generated in a circuit of the thermoelectric device by the thermoelectromotive force due to the Seebeck effect.

A plurality of first through-holes 311 may be formed in the first substrate 310. In addition, second through-holes 3811, 3821, 3831, and 3841 may be formed in the plurality of second substrates 381, 382, 383, and 384, respectively, and the plurality of first through-holes 311 may be disposed at positions corresponding to the second through-holes 3811, 3821, 3831, and 3841. Accordingly, a plurality of coupling members 400 may each pass through each of the plurality of first through-holes 311 and the second through-holes 3811, 3821, 3831, and 3841, and the first substrate 310 and the second substrate unit 380 may be fixed by the plurality of coupling members 400.

Meanwhile, when heat sinks 391, 392, 393, and 394 are disposed on the second substrates 381, 382, 383, and 384, respectively, third through-holes 3911, 3921, 3931, and 3941 may be formed in the heat sinks 391, 392, 393, and 394, respectively, and the plurality of first through-holes 311 may be disposed at positions corresponding to the second through-holes 3811, 3821, 3831, and 3841 and the third through-holes 3911, 3921, 3931, and 3941. Accordingly, the plurality of coupling members 400 may each pass through each of the plurality of first through-holes 311, the second through-holes 3811, 3821, 3831, and 3841, and the third through-holes 3911, 3921, 3931, and 3941, and the first substrate 310, the second substrate unit 380, and the heat sink 390 may be fixed by the plurality of coupling members 400.

As shown in FIGS. 6 to 8, when the second substrate unit 380 is divided into the plurality of second substrates 381, 382, 383, and 384, even when the second substrate unit 380 is frequently exposed to a high temperature, the problem of thermal deformation of the second substrate unit 380 due to thermal expansion may be prevented, and thus, the second substrate unit 380 may be easily applied to large-area applications.

In this case, a ratio of an area of each of the second substrates 381, 382, 383, and 384 to an area of the first substrate 310 may be in a range of 0.10 to 0.50, preferably 0.15 to 0.45, and more preferably 0.2 to 0.40.

When the second substrate unit 380 includes the plurality of second substrates 381, 382, 383, and 384 disposed to be spaced apart from each other, the first electrode unit 330 disposed on the first substrate 310 may be disposed to correspond to the plurality of second substrates 381, 382, 383, and 384.

That is, as shown in FIG. 8, the first electrode unit 330 includes a plurality of electrode groups disposed to be spaced apart from each other, and the second electrode unit 360 includes a plurality of electrode groups disposed to be spaced apart from each other. Each electrode group of the first electrode unit 330 and each electrode group of the second electrode unit 360 overlap each other in a direction from the first substrate 310 toward the second substrate unit 380 so as to form a first region A1, each electrode group of the first electrode unit 330 and each electrode group of the second electrode unit 360 overlap each other in the direction from the first substrate 310 toward the second substrate unit 380 so as to form a second region A2, and a separation region may be formed between the first region A1 and the second region A2.

More specifically, referring to FIG. 9, the first electrode unit 330 may include a plurality of electrode groups 331, 332, 333, and 334 disposed to be spaced apart from each other, and each of the electrode groups 331, 332, 333, and 334 may include a plurality of electrodes 330E disposed to be spaced apart from each other. Although not shown in FIG. 8, the second electrode unit 360 may include a plurality of electrode groups respectively overlapping the plurality of electrode groups 331, 332, 333, and 334 of the first electrode unit 330 in a direction perpendicular to the first substrate 310.

The first electrode unit 330 may include a first terminal electrode 330T1 connected to one of the plurality of electrode groups 331, 332, 333, and 334 and a second terminal electrode 330T2 connected to another one of the plurality of electrode groups 331, 332, 333, and 334. A connector (not shown) may be disposed in each of the first terminal electrode 330T1 and the second terminal electrode 330T2, and the first terminal electrode 330T1 and the second terminal electrode 330T2 may be connected to an external power source through the connectors. Meanwhile, the first electrode unit 330 may further include a connection electrode unit 330C configured to connect at least some of the plurality of electrode groups 331, 332, 333, and 334. The connection electrode unit 330C may include, for example, at least one of a first connection electrode 330C1 disposed between a 1-1 electrode group 331 and a 1-2 electrode group 332, a second connection electrode 330C2 disposed between the 1-1 electrode group 331 and a 2-1 electrode group 333, a third connection electrode 330C3 disposed between the 2-1 electrode group 333 and a 2-2 electrode group 334, and a fourth connection electrode for connecting the 1-2 electrode group 332 and the 2-2 electrode group 334. One of the plurality of electrode groups 331, 332, 333, and 334 may be directly or indirectly connected to another one thereof through the connection electrode unit 330C, and the plurality of electrode groups 331, 332, 333, and 334 may form an electrical path through the first terminal electrode 330T1 and the second terminal electrode 330T2.

Each of the electrode groups 331, 332, 333, and 334 may be disposed with a hole arrangement region 310H empty. Although not shown in the drawing, the second electrode unit 360 may also be disposed with a hole arrangement region corresponding to the hole arrangement region 310H empty. Here, the hole arrangement region 310H may refer to a region formed of virtual lines connecting edges disposed most adjacent to the hole 311 of the electrodes 330E disposed most adjacent to the hole 311. An area of the hole arrangement region may be four times or more, preferably six times or more, and more preferably eight times or more an area of the electrode 330E. Accordingly, withstand voltage performance of the thermoelectric module 300 may be maintained at alternating current (AC) 1 kV or more.

Here, a separation region between the plurality of electrode groups 331, 332, 333, and 334 may correspond to a separation region between the plurality of second substrates 381, 382, 383, and 384, and a separation distance between the plurality of electrode groups 331, 332, 333, and 334 may be greater than a separation distance between the plurality of electrodes 330E in each of the electrode groups 331, 332, 333, and 334.

For example, when the first electrode unit 330 includes the 1-1 electrode group 331, the 1-2 electrode group 332 disposed to be spaced apart from the 1-1 electrode group 331 in a first direction, the 2-1 electrode group 333 disposed to be spaced apart from the 1-1 electrode group 331 in a second direction perpendicular to the first direction, and the 2-2 electrode group 334 disposed to be spaced apart from the 2-1 electrode group 333 in the first direction and to be spaced apart from the 1-2 electrode group 332 in the second direction, the 1-1 electrode group 331 and the 2-1 electrode group 333 may be spaced apart from the 1-2 electrode group 332 and the 2-2 electrode group 334 in the first direction, and the 1-1 electrode group 331 and the 1-2 electrode group 332 may be spaced apart from the 2-1 electrode group 333 and the 2-2 electrode group 334 in the second direction.

Accordingly, when the first substrate 310 on which the first electrode unit 330 is mounted is exposed to a high temperature in a manufacturing process, the first substrate 310 may be warped in a W-shape not only in the first direction but also in the second direction around the separation region of each electrode group. Such a W-shaped warpage phenomenon may lower a bonding force between the thermoelectric module 300 and the cooling unit C, and may lower the long-term reliability, durability, and power generation performance of the thermoelectric module 300.

According to the embodiment of the present invention, in order to improve the warpage phenomenon of the first substrate 310, a dummy unit is further disposed in the separation region between the electrode groups.

Referring to FIG. 10, a dummy unit 900 may be further disposed on the first substrate 310 in at least a portion of the separation region between the first region A1 and the second region A2. For example, the dummy unit 900 may be disposed on a side surface of each of the plurality of electrode groups 331, 332, 333, and 334 in at least a portion of the separation region between the plurality of electrode groups 331, 332, 333, and 334. When the dummy unit 900 is disposed as described above, stress may be uniformly applied to the entire first substrate 310, thereby preventing the W-shaped warpage phenomenon.

For example, a first dummy unit 910 may be disposed between the 1-1 electrode group 331 and the 1-2 electrode group 332. In addition, a second dummy unit 920 may be disposed between the 2-1 electrode group 333 and the 2-2 electrode group 334. In addition, a third dummy unit 930 may be disposed between the 1-1 electrode group 331 and the 1-2 electrode group 332, and the 2-1 electrode group 333 and the 2-2 electrode group 334. At this point, the first dummy unit 910 and the second dummy unit 920 may be spaced apart from each other by the third dummy unit 930.

Alternatively, the first connection electrode 330C1 disposed between the 1-1 electrode group 331 and the 1-2 electrode group 332 may be disposed between the first dummy unit 910 and the third dummy unit 930, and the third connection electrode 330C3 disposed between the 2-1 electrode group 333 and the 2-2 electrode group 334 may be disposed between the second dummy unit 920 and the third dummy unit 930.

Accordingly, when the first substrate 310 is exposed to a high temperature, stress may be uniformly applied to the entire first substrate 310, thereby minimizing the W-shaped warpage phenomenon of the first substrate 310.

Here, at least one of the first dummy unit 910, the second dummy unit 920, and the third dummy unit 930 may include a plurality of dummy structures each having the same shape and size as each electrode 330E included in each electrode group and disposed to be spaced apart from each other.

Accordingly, when the first substrate 310 is exposed to a high temperature, stress may be uniformly applied to the entire first substrate 310, thereby minimizing the W-shaped warpage phenomenon of the first substrate 310 and facilitating the design and arrangement of the dummy unit 900 in a manufacturing process.

In this case, each dummy structure may be a metal layer. For example, the metal layer has the same material, shape, and size as the electrode 330E, but the thermoelectric leg is not disposed on the metal layer, and the metal layer may not be electrically connected to other electrodes 330E. Accordingly, it is easy to design and arrange the dummy unit 900 in the manufacturing process.

Alternatively, each dummy structure may be a resin layer. For example, the resin layer may include at least one of an epoxy resin and a polyimide resin. Since the resin layer has heat-resistant performance, thermal conduction between each electrode group may be prevented, and thermal conduction efficiency between the electrode in each electrode group and the first substrate may be increased. In addition, since the resin layer has insulating performance, the withstand voltage performance of the first substrate 310 may be increased.

Meanwhile, according to the embodiment of the present invention, when the first electrode unit 330 disposed on the first substrate 310 includes the first terminal electrode 330T1 and the second terminal electrode 330T2, a separate configuration may be required for the withstand voltage performance of the first substrate 310 side.

Accordingly, according to the embodiment of the present invention, the first insulating layer 320 disposed on the first substrate 310 may include a plurality of insulating layers. For example, a 1-1 insulating layer 321 may be disposed on the first substrate 310, a 1-2 insulating layer 322 may be disposed on the 1-1 insulating layer 321, and the first electrode unit 330 and the dummy unit 900 may be disposed on the 1-2 insulating layer 322. As shown in the drawing, the 1-1 insulating layer 321 may be disposed on the entire surface of the first substrate 310, and the 1-2 insulating layer 322 may be disposed only in a region in which the first electrode unit 330 is disposed. The contents of the first insulating layer 172 and the second insulating layer 174 described with reference to FIG. 5 may be equally applied to contents of the 1-1 insulating layer 321 and the 1-2 insulating layer 322, respectively.

FIG. 11 is a perspective view of a thermoelectric module according to another embodiment of the present invention, and FIG. 12 is a cross-sectional view of the thermoelectric module of FIG. 11. Redundant descriptions of the same contents as those described with reference to FIGS. 1 to 10 will be omitted.

Referring to FIGS. 11 and 12, an insulator 1000 may be further disposed in separation regions between a plurality of second substrates 381, 382, 383, and 384. Accordingly, the insulator 1000 may bond the plurality of second substrates 381, 382, 383, and 384, and thus the separation regions between the plurality of second substrates 381, 382, 383, and 384 may be sealed.

Here, the insulator 1000 may be disposed to extend from the separation regions between the plurality of second substrates 381, 382, 383, and 384 to an upper surface of a dummy unit 900. Alternatively, the insulator 1000 and the dummy unit 900 may be integrally formed. Accordingly, a problem of external foreign substances or moisture penetrating into P-type thermoelectric legs 340 and N-type thermoelectric legs 350 between a first electrode unit 330 and a second electrode unit 360 may be prevented, and insulation, sealing, and heat insulation between the first substrate 310 and the second substrate unit 380 may be maintained.

FIG. 13 illustrates a bonding structure between the heat sink and the second substrate in the thermoelectric module according to one embodiment of the present invention.

Referring to FIG. 13, the thermoelectric device 300 may be coupled by the plurality of coupling members 400. For example, when the heat sink 390 is disposed on the second substrate 380, the plurality of coupling members 400 may couple the heat sink 390 and the second substrate 380, couple the heat sink 390, the second substrate 380, and the first substrate (not shown), couple the heat sink 390, the second substrate 380, the first substrate (not shown), and the cooling unit (not shown), couple the second substrate 380, the first substrate (not shown), and the cooling unit (not shown), or couple the second substrate 380 and the first substrate (not shown). Alternatively, the first substrate (not shown) and the cooling unit (not shown) may be connected from the outside of an effective region on the first substrate (not shown) through another coupling member.

To this end, a through hole S through which the coupling member 400 passes may be formed in each of the heat sink 390, the second substrate 380, the first substrate (not shown), and the cooling unit (not shown). Here, a separate insulating insertion member 410 may be further disposed between the through hole S and the coupling member 400. The separate insulating insertion member 410 may be an insulating insertion member surrounding an outer circumferential surface of the coupling member 400 or an insulating insertion member surrounding a wall surface of the through hole S. Accordingly, it is possible to increase an insulation distance of the thermoelectric device.

Meanwhile, the insulating insertion member 410 may have shapes as illustrated in FIGS. 13A and 13B.

Referring to FIG. 13A, a diameter d2' of the through hole S in a first surface of the second substrate 280, which is in contact with the second electrode, may be equal to a diameter of the through hole in a first surface of the first substrate, which is in contact with the first electrode. At this point, depending on the shape of the insulating insertion member 410, the diameter d2' of the through hole S formed in the first surface of the second substrate 380 may be different from a diameter d2 of the through hole S formed in a second surface opposite to the first surface. Although not shown in the drawing, when the insulating insertion member 410 is disposed only on a portion of an upper surface of the second substrate 380 without forming a step in a region of the through hole S, or the insulating insertion member 410 is disposed to extend from the upper surface of the second substrate 380 to a portion or all of the wall surface of the through hole S, the diameter d2' of the through hole S formed in the first surface of the second substrate 380 may be equal to the diameter d2 of the through hole S formed in the second surface opposite to the first surface.

Referring to FIG. 13B, the diameter d2' of the through hole S in the first surface of the second substrate 380, which is in contact with the second electrode, may be greater than the diameter of the through hole in the first surface of the first substrate, which is in contact with the first electrode, depending on the shape of the insulating insertion member 410. At this point, the diameter d2' of the through hole S in the first surface of the second substrate 380 may be 1.1 to 2.0 times the diameter of the through hole in the first surface of the first substrate. When the diameter d2' of the through hole S in the first surface of the second substrate 380 is less than 1.1 times the diameter of the through hole in the first surface of the first substrate, the insulation effect of the insulating insertion member 410 is insignificant, which may cause insulation breakdown of the thermoelectric device, and when the diameter d2' of the through hole S in the first surface of the second substrate 380 exceeds 2.0 times the diameter of the through hole in the first surface of the first substrate, a region occupied by the through hole S is relatively increased in size, so that an effective area of the second substrate 380 is reduced, thereby reducing efficiency of the thermoelectric device.

In addition, due to the shape of the insulating insertion member 410, the diameter d2' of the through hole S formed in the first surface of the second substrate 380 may be different from the diameter d2 of the through hole S formed in the second surface opposite to the first surface. As described above, when the step is not formed in the region of the through hole S of the second substrate 380, the diameter d2' of the through hole S formed in the first surface of the second substrate 380 may be equal to the diameter d2 of the through hole S formed in the second surface opposite to the first surface.

Hereinafter, results obtained by testing a warpage improvement effect of the first substrate in the thermoelectric device according to the embodiment of the present invention will be described.

FIG. 14A is a top view of a substrate and an electrode unit of a thermoelectric device according to a comparative example, FIG. 14B is a top view of a substrate and an electrode unit of a thermoelectric device according to Example 1, FIG. 14C is a top view of a substrate and an electrode unit of a thermoelectric device according to Example 2, and FIG. 14D is a top view of a substrate and an electrode unit of a thermoelectric device according to Example 3.

It was confirmed that a W-shaped warpage occurred in both a horizontal direction and a vertical direction of a first substrate when a dummy unit is not disposed in a separation region between a plurality of electrode groups as shown in FIG. 14A, and in particular, a warpage width in the horizontal direction was 135 μm and a warpage width in the vertical direction was 207 μm. Here, the warpage width refers to a height difference between the lowest point and the highest point of the first substrate in a direction perpendicular to a plane direction of the first substrate.

In contrast, as shown in FIG. 14B, when a first dummy unit 910 was disposed in a separation region between a 1-1 electrode group 331 and a 1-2 electrode group 332 among a plurality of electrode groups, and a second dummy unit 920 was disposed in a separation region between a 2-1 electrode group 333 and a 2-2 electrode group 334 among the plurality of electrode groups, a U-shaped warpage occurred in the horizontal direction of a first substrate, and the warpage width in the horizontal direction was also reduced to 100 μm. In addition, it can be seen that even though the W-shaped warpage occurred in the vertical direction of the first substrate, the warpage width in the vertical direction was 138 μm and was significantly improved as compared to the comparative example.

Further, as shown in FIG. 14C, when a third dummy unit 930 was disposed between a 1-1 electrode group 331 and a 1-2 electrode group 332 and a 2-1 electrode group 333 and a 2-2 electrode group 334 among a plurality of electrode groups, the U-shaped warpage occurred in the horizontal direction of a first substrate, and the warpage width in the horizontal direction was significantly reduced to 83 μm. In addition, it can be seen that even though the W-shaped warpage occurred in the vertical direction of the first substrate, the warpage width in the vertical direction was 182 μm and was improved as compared to the comparative example.

Further, as shown in FIG. 14D, it can be seen that the U-shaped warpage occurred in both the horizontal direction and the vertical direction of a first substrate when a first dummy unit 910, a second dummy unit 920, and a third dummy unit 930 were all disposed in separation regions between a plurality of electrode groups. In addition, a width of the first substrate in the horizontal direction was 73 μm, and the width of the first substrate in the vertical direction was 100 μm, and it can be seen that the warpage width was greatly improved in both the horizontal direction and the vertical direction as compared to the comparative example.

As described above, when the warpage shape and the warpage width of the first substrate are improved, the bonding force between the thermoelectric device and the cooling unit may be increased, and accordingly, the thermoelectric device having excellent long-term reliability, durability, and power generation performance may be obtained.

Although the example in which the second substrate unit is divided into four substrates is mainly described, the present invention is not limited thereto, and the second substrate unit may be divided into two or more substrates.

Hereinafter, various division schemes of the second substrate unit, and an electrode arrangement structure according thereto will be described.

FIG. 15 is a perspective view of a thermoelectric device according to one embodiment of the present invention, FIG. 16 is a top view of a first substrate, an insulating layer, and a plurality of first electrodes in the embodiment of FIG. 15, FIG. 17 is a perspective view of a thermoelectric device according to another embodiment of the present invention, FIG. 18 is a top view of a first substrate, an insulating layer, and a plurality of first electrodes in the embodiment of FIG. 17, FIG. 19 is a perspective view of a thermoelectric device according to still another embodiment of the present invention, and FIG. 20 is a top view of a first substrate, an insulating layer, and a plurality of first electrodes in the embodiment of FIG. 19. For convenience of description, redundant descriptions of the same contents as those described with reference to FIGS. 1 to 14 will be omitted.

Referring to FIGS. 15 to 20, a thermoelectric device according to the embodiment of the present invention may include a first substrate 310, an insulating layer 320, a first electrode unit 330, semiconductor structures 340 and 350, a second electrode unit 360, an insulating layer 370, and a second substrate unit 380, the second substrate unit 380 may be divided into a plurality of second substrates, and a heat sink 390 may be disposed on each of the second electrodes. When a voltage is applied to the thermoelectric device 300, the first substrate 310 may absorb heat according to the Peltier effect and act as a low-temperature unit, and the second substrate unit 380 may emit heat and act as a high-temperature unit. Alternatively, when different temperatures are applied to the first substrate 310 and the second substrate unit 3800, a thermoelectromotive force is generated while electrons in a high-temperature region move to a low-temperature region due to the temperature difference. This is called the Seebeck effect, and electricity may be generated in a circuit of the thermoelectric device by the thermoelectromotive force due to the Seebeck effect. A plurality of first through-holes 311 may be formed in the first substrate 310. Similarly, a plurality of second through-holes 3901 may be formed in the second substrate unit 380 and the heat sink 390, and the plurality of first through-holes 311 may be disposed at positions corresponding to the plurality of second through-holes 3901. Accordingly, a plurality of coupling members (not shown) may pass through the plurality of first through-holes 311 and the plurality of second through-holes 3901, respectively, and the first substrate 310 and the second substrate unit 3901 may be fixed by the plurality of coupling members (not shown).

For convenience of description, FIGS. 15, 17, and 19 are illustrated by omitting detailed configurations of the insulating layer 320, the first electrode unit 330, the semiconductor structures 340 and 350, and the second electrode unit 380.

In general, a coefficient of thermal expansion (CTE) of a copper substrate is about $18*10{-6}/mK$, a CTE of the thermoelectric leg, which is a semiconductor structure, is about $17.5*10{-6}/mK$, a CTE of each of a first insulating layer 321 and a second insulating layer 322 is greater than a CTE of each of the copper substrate and the thermoelectric leg, and the CTE of the second insulating layer 322 is greater than the CTE of the first insulating layer 321. For example, in order to satisfy both bonding performance of the second insulating layer 322 and withstand voltage performance of the first insulating layer 321, the CTE of the second insulating layer 322 may be two or more times the CTE of the first insulating layer 321.

As shown in FIGS. 16, 18, and 20, an area of the second insulating layer 322 may be less than that of the first insulating layer 321. That is, the second insulating layer 322 may be disposed on a portion of the first insulating layer 321 rather than on the entire surface of the first insulating layer 321. Accordingly, a warpage phenomenon of the first substrate 310 due to a difference in CTE between the first insulating layer 321 and the second insulating layer 322 may be improved, and thermal stress may be mitigated. Accordingly, a problem in which the first electrode 330 or the semiconductor structures 340 and 350 are separated or electrically opened may be prevented, a heat transfer effect may be improved, and finally, an amount of power generation or cooling characteristics of the thermoelectric device may be improved.

More specifically, the second insulating layer 322 may include a region P1 in which the first electrode unit 330, the plurality of semiconductor structures 340 and 350, and the second electrode unit 380 vertically overlap. Hereinafter, in the present specification, a vertical direction may mean a direction (a third direction) toward the second substrate unit 380 from the first substrate 310.

In addition, the second insulating layer 322 may further include protrusion patterns P2 and P3 protruding toward a first outer side S1 of the first substrate 310 from the region P1 in which the first electrode unit 330, the plurality of semiconductor structures 340 and 350, and the second electrode unit 380 vertically overlap. Here, the first outer side S1 is one of first to fourth outer sides S1 to S4 constituting the first substrate 310, and may be a surface in a direction in which terminal electrodes 330T1 and 330T2 protrude. In the present specification, the terminal electrodes 330T1 and 330T2 are electrodes for connecting electric wires, and may be disposed on the same plane as the first electrode unit 321 on the second insulating layer 322. An area of each of the terminal electrodes 330T1 and 330T2 may be greater than an area of each electrode included in the first electrode unit 330, and accordingly, a connector for electric wire connection may be disposed on each of the terminal electrodes 330T1 and 330T2. When the terminal electrodes 330T1 and 330T2 protrude toward the first outer side Si from the first electrode unit 330, a distance from the first outer side S1 of the first substrate 310 to the second outer side S2 opposite to the first outer side Si, that is, a distance in the second direction may be greater than a distance from the third outer side S3 of the first substrate 310 to the fourth outer side S4 opposite to the third outer side S3, that is, a distance in the first direction.

According to the embodiment of the present invention, the protrusion patterns P2 and P3 may include a first protrusion pattern P2 and a second protrusion pattern P3, which are disposed to be spaced apart from each other, and the first terminal electrode 330T1 may be disposed on the first protrusion pattern P2, and the second terminal electrode 330T2 may be disposed on the second protrusion pattern P3. Accordingly, since the second insulating layer 322 may not be disposed on a portion of the first substrate 310, the problem in which the first substrate 310 is warped due to the second insulating layer 322 having a large CTE may be minimized.

More specifically, according to the embodiment of the present invention, a width L1+L2 of the protrusion patterns P2 and P3 may be less than a width L of the region P1 in which the plurality of first electrodes 330, the plurality of semiconductor structures 340 and 350, and the plurality of second electrodes 360 vertically overlap, and the protrusion patterns P2 and P3 may be spaced apart from the first outer side S1 of the first substrate 310. In the present specification, a width may be defined as a distance in the first direction, and a length may be defined as a distance in the second direction. Accordingly, the second insulating layer 322 is not disposed on a portion between the region P1 in which the first electrode unit 330, the plurality of semiconductor structures 340 and 350, and the second electrode unit 360 vertically overlap, and the first outer side S1 of the first substrate 310, so that the warpage of the first substrate 310 in the second direction may be reduced.

At this point, a separation distance d1 between the first protrusion pattern P2 and the second protrusion pattern P3 may be 0.9 to 2 times, preferably 0.95 to 1.5 times, and more preferably 0.97 to 1.2 times each of a distance d2 between the third outer side S3 of the first substrate 310 and the first protrusion pattern P2 and a distance d3 between the fourth outer side S4 of the first substrate 310 and the second protrusion pattern P3. Accordingly, a region, in which the second insulating layer 322 is not disposed, between the third outer side S3 and the fourth outer side S4 of the first substrate 310 and a region, in which the second insulating layer 322 is not disposed, between the first protrusion pattern P2 and the second protrusion pattern P3 may act as buffers against thermal expansion of the protrusion patterns P2 and P3 of the second insulating layer 322, so that the warpage of the first substrate 310 in the first direction may be reduced, and the warpage of the first substrate 310 in the first direction may be symmetrical with respect to a center of the first substrate 310 in the first direction.

Meanwhile, as described above, the protrusion patterns P2 and P3 may be spaced apart from the first outer side S1 of the first substrate 310. Accordingly, the region, in which the second insulating layer 322 is not disposed, between the protrusion patterns P2 and P3 and the first outer side S1 of the first substrate 310 acts as a buffer against thermal expansion of the protrusion patterns P2 and P3 of the second insulating layer 322, so that the warpage of the first substrate 310 in the second direction may be reduced.

At this point, a sealing member (not shown) may be disposed to be in contact with the first insulating layer 321 at the first outer side Si, and may be disposed to be in contact with the second insulating layer 322 at the second outer side S2. That is, since the second insulating layer 322 is not disposed on the first outer side S1 of the first substrate 310, even when a length of the first substrate 310 in the second direction is increased due to the terminal electrodes T1 and T2, the warpage of the first substrate 310 in the second direction may be reduced. At this point, a protruding length of each of the protrusion patterns P2 and P3 may be greater than a length from the protrusion patterns P2 and P3 to the first outer side S1 of the first substrate 310. Accordingly, since a length of the first substrate 310 in a Y direction is not greater than a required length, the warpage of the first substrate 310 in the second direction may be reduced.

Meanwhile, according to the embodiment of the present invention, the first insulating layer 321 may be disposed to be spaced apart from at least some of edges of the first substrate 310, that is, the first to fourth outer sides Si to S4 of the first substrate 310. When the first insulating layer 321 is disposed to be spaced apart from at least some of the edges of the first substrate 310, the edges of the first substrate 310 may act as buffers against thermal expansion of the first insulating layer 321, thereby reducing the warpage of the first substrate 310. Further, as an example, the CTE of the first insulating layer 321 may be different from that of the first substrate 310, and may be greater than that of the first substrate 310.

Similarly, the second insulating layer 322 may be disposed to be spaced apart from at least some of edges of the first insulating layer 321. When the second insulating layer 322 is disposed to be spaced apart from at least some of the edges of the first insulating layer 321, the edges of the first insulating layer 321 may act as buffers against thermal expansion of the second insulating layer 322, thereby reducing the warpage of the first substrate 310. Further, as an example, the CTE of the second insulating layer 322 may be greater than that of the first insulating layer 321.

Meanwhile, the second substrate unit 380 may not vertically overlap the protrusion patterns P2 and P3 of the second insulating layer 322. Since the terminal electrodes 330T1 and 330T2 are disposed on the protrusion patterns P2 and P3 of the second insulating layer 322, and connectors for electric wire connection are disposed on the terminal electrodes 330T1 and 330T2, when the second substrate unit 380 does not vertically overlap the protrusion patterns P2 and P3 of the second insulating layer 322, the electric wire connection through the connectors is easily performed.

As described above, a second concave surface R2 of the second insulating layer 322 may be disposed around each electrode included in the first electrode unit 330. Each electrode may have a shape in which a length in the first direction and a length in the second direction are different from each other. Accordingly, the second concave surface R2 of the second insulating layer 322 may have a plurality of shapes whose lengths in the second direction or in the first direction are different. A structure in which the second concave surface R2 of the second insulating layer 324 is located between electrodes is formed in the region in which the first electrode unit 330 and the second electrode unit 360 vertically overlap each other, and a flat portion other than a concave portion may be located in the protrusion patterns P2 and P3 of the second insulating layer 324. Accordingly, stress applied from the first substrate 310 to the second insulating layer 322 is mitigated in the first direction and the second direction, so that the substrate warpage phenomenon may be prevented, and cracks or delamination of the first insulating layer 321 and the second insulating layer 322 may be prevented. However, the present invention is not limited thereto, and since a distance between the terminal electrode 330T1 and the first electrode 330 is greater than a distance between adjacent electrodes in the first electrode unit 330, in the protrusion patterns P2 and P2 of the second insulating layer 322, the second concave surface R2 of the second insulating layer 322 may appear as a flat portion, and a concave surface having a width in the first direction and a length in the second direction greater than those of the second concave surface R2 of the second insulating layer 322 disposed between adjacent electrodes in the first electrode unit 330 may be disposed. Since the second concave surface R2 of the second insulating layer 322 has different widths in the region P1 in which the first electrode unit 330 and the second electrode unit 360 vertically overlap each other, and the widths in the protrusion patterns P2 and P3 may also have different structures, the warpage of the substrate may be suppressed, and cracks or delamination of the second insulating layer 322 may be effectively prevented.

In the above-described embodiments, the configuration in which the first insulating layer 321 and the second insulating layer 322 are separately disposed is illustrated, but the present invention is not limited thereto, and the first insulating layer 321 and the second insulating layer 322 may be disposed as a single layer. Even when the first insulating layer 321 and the second insulating layer 322 are disposed as a single layer, a resin material including an inorganic filler may be applied to secure the above-described thermal conduction and withstand voltage characteristics, but the present invention is not limited thereto. In addition, even when the first insulating layer 321 and the second insulating layer 322 are disposed as a single layer, the second insulating layer 322 may have the same pattern.

Meanwhile, according to the embodiment of the present invention, in order to reduce the warpage of the substrate, the second substrate unit 380 may be composed of a plurality of divided substrates for one first substrate 310.

The second substrate unit 380 may be divided in the second direction as shown in FIG. 15, divided in the first direction as shown in FIG. 17, or divided in the first direction and the second direction as shown in FIG. 19. Here, the division in the second direction may mean that the division is made between the third outer side S3 and the fourth outer side S4 of the first substrate 310 in a direction parallel to the third outer side S3 and the fourth outer side S4, and the division in the first direction may mean that the division is made between the first outer side S1 and the second outer side S2 of the first substrate 310 in a direction parallel to the first outer side S1 and the second outer side S2.

According to the embodiment of the present invention, the first electrode unit 330 may be disposed on one first substrate 310 according to a division direction or division position of the second substrate unit 380. Accordingly, even when the second substrate unit 380 includes a plurality of second substrates disposed to be spaced apart from each other, the first electrode unit 330, the semiconductor structures 340 and 350, and the second electrode unit 360 may be electrically connected using a pair of terminal electrodes 330T1 and 330T2, and a maximum number of semiconductor structures 340 and 350 per unit area may be accommodated, so that high thermoelectric performance may be obtained.

Referring to FIGS. 16, 18, and 20, the first electrode unit 330 may be disposed on the insulating layer 320, the first electrode unit 330 may include a plurality of electrode groups, and each of the electrode groups includes a plurality of first electrodes.

For example, as shown in FIGS. 15 and 16, when the second substrate unit 380 includes a 2-1 substrate 380-1 and a 2-2 substrate 380-2 disposed to be spaced apart from each other in the second direction, a first electrode group G1 may be disposed to vertically overlap the 2-1 substrate 380-1, and a second electrode group G2 may be disposed to vertically overlap the 2-2 substrate 380-2. Accordingly, the first electrode group G1 and the second electrode group G2 may be divided between the third outer side S3 and the fourth outer side S4 of the first substrate 310.

The first terminal electrode 330T1 may be disposed on the first electrode group G1 side, the second terminal electrode 330T2 may be disposed on the second electrode group G2 side, and the first electrode group G1 and the second electrode group G2 may be connected by a connection electrode CE1. The first electrode group G1 and the second electrode group G2 may include a plurality of first electrodes E1 and a plurality of first electrodes E2, respectively, and the connection electrode CE1 may be disposed in a row, which is closest to the first terminal electrode 330T1 and the second terminal electrode 330T2, among rows of the plurality of first electrodes E1 and E2 in the first electrode group G1 and the second electrode group G2. A long side of the connection electrode CE1 is longer than a long side of each of the first electrodes E1 and E2, and at least a portion of the connection electrode CE1 may not vertically overlap the 2-1 substrate 380-1 and the 2-2 substrate 380-2. That is, at least a portion of the connection electrode CE1 may be disposed in a separation region between the 2-1 substrate 380-1 and the 2-2 substrate 380-2, and may connect the first electrode group G1 and the second electrode group G2.

As shown in FIGS. 17 and 18, when the second substrate unit 380 includes a 2-3 substrate 380-3 and a 2-4 substrate 380-4 disposed to be spaced apart from each other in the first direction, a third electrode group G3 may be disposed to vertically overlap the 2-3 substrate 380-3, and a fourth electrode group G4 may be disposed to vertically overlap the 2-4 substrate 380-4. Accordingly, the third electrode group G3 and the fourth electrode group G4 may be divided between the first outer side S1 and the second outer side S2 of the first substrate 310.

Here, both the first terminal electrode 330T1 and the second terminal electrode 330T2 may be disposed on the third electrode group G3 side, and two connection electrodes CE2 and CE3 disposed adjacent to each other may connect the third electrode group G3 and the fourth electrode group G4. The two connection electrodes CE2 and CE3 may include a connection electrode CE2 and a connection electrode CE3 adjacent to the connection electrode CE2, which are disposed side by side. In the present specification, the phrase "two connection electrodes are disposed side by side adjacent to each other" may mean that the two connection electrodes are disposed such that a long side of one thereof and a long side of the other thereof are adjacent to each other and face each other. That is, it may mean that two connection electrodes are disposed in parallel to each other in a long side direction thereof. Although not shown in the drawing, at least a portion of the two connection electrodes CE2 and CE3 may not vertically overlap the 2-3 substrate 380-3 and the 2-4 substrate 380-4, and may be disposed in a separation region between the 2-3 substrate 380-3 and the 2-4 substrate 380-4.

At this point, the two connection electrodes CE2 and CE3 may be disposed in two columns closest to the outermost column among columns of a plurality of first electrodes E3 and a plurality of first electrodes E4 respectively in the third electrode group G3 and the fourth electrode group G4.

In FIG. 18, it is illustrated that the two connection electrodes CE2 and CE3 are disposed in two columns, which are closest to the outermost column from the left side, among the columns of the plurality of first electrodes E3 and E4 in the third electrode group G3 and the fourth electrode group G4, but the present invention is not limited thereto. Two connection electrodes for connecting two electrode groups divided between the first outer side S1 and the second outer side S2 of the first substrate 310 may be disposed side by side adjacent to two columns, which are closest to the outermost column from the right side, among columns of the plurality of first electrodes in the two electrode groups.

Referring to FIGS. 19 and 20, when the second substrate unit 380 includes a 2-11 substrate 380-11, a 2-12 substrate 380-12, a 2-21 substrate 380-21, and a 2-22 substrate 380-22, which are disposed to be spaced apart from each other in the first direction and the second direction, an eleventh electrode group G11 may be disposed to vertically overlap the 2-11 substrate 380-11, a twelfth electrode group G12 may be disposed to vertically overlap the 2-12 substrate 380-12, a twenty-first electrode group G21 may be disposed to vertically overlap the 2-21 substrate 380-21, and a twenty-second electrode group G22 may be disposed to vertically overlap the 2-22 substrate 380-22. Accordingly, the eleventh electrode group G11 and the twelfth electrode group G12, and the twenty-first electrode group G21 and the twenty-second electrode group G22 may be divided between the first outer side Si and the second outer side S2 of the first substrate 310, and the eleventh electrode group G11 and the twenty-first electrode group G21, and the twelfth electrode group G12 and the twenty-second electrode group G22 may be divided between the third outer side S3 and the fourth outer side S4 of the first substrate 310.

Here, the first terminal electrode 330T1 may be disposed on the eleventh electrode group G11 side, the second terminal electrode 330T2 may be disposed on the twelfth electrode group G12 side, and the eleventh electrode group G11 and the twelfth electrode group G12 may be connected by the connection electrode CE1. The eleventh electrode group G11 and the twelfth electrode group G12 may include a plurality of first electrodes E11 and a plurality of first electrodes E12, respectively, and the connection electrode CE1 may be disposed in a row, which is closest to the first terminal electrode 330T1 and the second terminal electrode 330T2, among rows of the plurality of first electrodes E11 and E12 in the eleventh electrode group G11 and the twelfth electrode group G12. Although not shown in the drawing, at least a portion of the connection electrode CE1 may be disposed to vertically overlap a separation region between the 2-11 substrate 380-11 and the 2-12 substrate 380-12.

In addition, the two connection electrodes CE2 and CE3 disposed side by side adjacent to each other may connect the eleventh electrode group G11 and the twenty-first electrode group G21. Although not shown in the drawing, at least a portion of the two connection electrodes CE2 and CE3 may not vertically overlap the 2-11 substrate 380-11 and the 2-21 substrate 380-21, and may be disposed to vertically overlap a separation region between the 2-11 substrate 380-11 and the 2-21 substrate 380-21.

At this point, the two connection electrodes CE2 and CE3 may be disposed side by side with each other in two columns, which are closest to the outermost column, among columns of the plurality of first electrodes E11 and E21 in the eleventh electrode group G11 and the twenty-first electrode group G21.

In FIG. 20, it is illustrated that the two connection electrodes CE2 and CE3 are disposed in two columns, which are closest to the outermost column from the left side, among the columns of the plurality of first electrodes E11 and E21 in the eleventh electrode group G11 and the twenty-first electrode group G21, but the present invention is not limited thereto. Two connection electrodes for connecting two electrode groups divided between the first outer side Si and the second outer side S2 of the first substrate 310 may be disposed side by side in two columns, which are closest to the outermost column from the right side, among the columns of the plurality of first electrodes in the two electrode groups.

In addition, two connection electrodes CE5 and CE6 disposed side by side adjacent to each other may connect the eleventh electrode group G11 and the twelfth electrode group G12. As described above, since the connection electrode CE1 is disposed in the row, which is closest to the first terminal electrode 330T1 and the second terminal electrode 330T2, among the rows of the plurality of first electrodes E11 and E12 in the eleventh electrode group G11 and the twelfth electrode group G12, the two connection electrodes CE5 and CE6 may be disposed side by side in the outermost row, which is disposed farthest from the first terminal electrode 330T1 and the second terminal electrode 330T2, and a row adjacent thereto among rows of the plurality of first electrodes E11 and E12 in the eleventh electrode group G11 and the twelfth electrode group G12.

In the same manner, two connection electrodes CE7 and CE8 disposed side by side adjacent to each other may connect the twenty-first electrode group G21 and the twenty-second electrode group G22, and may be disposed side by side in the outermost row and a row adjacent thereto among rows of the plurality of first electrodes E21 and E22 in the twenty-first electrode group G21 and the twenty-second electrode group G22.

In the embodiments of FIGS. 15 to 20, the dummy unit described with reference to FIGS. 10 to 12 may be further disposed in the separation region between the plurality of electrode groups. The dummy unit may include a plurality of dummy structures each having the same shape and size as the electrode included in each electrode group and disposed to be spaced apart from each other. Accordingly, when the first substrate 310 is exposed to a high temperature, stress is uniformly applied to the entire first substrate 310, thereby minimizing the warpage shape of the first substrate 310.

In the above, the embodiments in which the second substrate unit 380 is divided into two substrates in the first direction or is divided into two substrates in the second direction is described, but may also be applied to an embodiment in which the second substrate unit 380 is divided into two or more substrates in the first direction or is divided into two or more in the second direction.

According to the embodiment of the present invention, when a first row electrode group, a second row electrode group, and a third row electrode group are sequentially disposed, the first row electrode group and the second row electrode group may be connected by two connection electrodes disposed side by side adjacent to each other, and the second row electrode group and the third row electrode group may be connected by the other two connection electrodes disposed side by side adjacent to each other. In this case, the two connection electrodes and the other two connection electrodes may be disposed in two columns closest to the outermost column of the first electrode unit. For example, when two connection electrodes connecting the first row electrode group and the second row electrode group are disposed in two columns closest to the left outermost column in the first electrode unit, the other two connection electrodes connecting the second row electrode group and the third row electrode group may be disposed in two columns closest to the right outermost column in the first electrode unit. In contrast, when two connection electrodes connecting the first row electrode group and the second row electrode group are disposed in two columns closest to the right outermost column in the first electrode unit, the other two connection electrodes connecting the second row electrode group and the third row electrode group may be disposed in two columns closest to the left outermost column in the first electrode unit.

According to the embodiment of the present invention, when a first column electrode group, a second column electrode group, and a third column electrode group are sequentially disposed, the first column electrode group, the second column electrode group, and the third column electrode group may be connected by at least one connection electrode. In this case, the at least one connection electrode may be disposed on the outermost row in the first column electrode group, the second column electrode group, and the third column electrode group.

FIGS. 21 to 24 are schematic views illustrating an arrangement of electrodes included in a thermoelectric device according to the embodiment of the present invention. For convenience of description, a detailed electrode arrangement is not illustrated, and only an electrode connection direction is schematically illustrated.

Referring to FIG. 21, an eleventh electrode group G11 and a twelfth electrode group G12, and a twenty-first electrode group G21 and a twenty-second electrode group G22 may be divided between a first outer side Si and a second outer side S2 of a first substrate 310, and the twenty-first electrode group G21 and the twenty-second electrode group G22, and a thirty-first electrode group G31 and a thirty-second electrode group G32 may be divided between the first outer side Si and the second outer side S2 of the first substrate 110.

In addition, the eleventh electrode group G11, the twenty-first electrode group G21, and the thirty-first electrode group G31 may be divided from the twelfth electrode group G12, the twenty-second electrode group G22, and the thirty-second electrode group G32 between a third outer side S3 and a fourth outer side S4 of the first substrate 110.

Referring to FIG. 22, an eleventh electrode group G11 and a twelfth electrode group G12, and a twenty-first electrode group G21 and a twenty-second electrode group G22 may be divided between a first outer side Si and a second outer side S2 of a first substrate 310, the twenty-first electrode group G21 and the twenty-second electrode group G22, and a thirty-first electrode group G31 and a thirty-second electrode group G32 may be divided between the first outer side Si and the second outer side S2 of the first substrate 310, and the thirty-first electrode group G31 and the thirty-second electrode group G32, and a forty-first electrode group G41 and a forty-second electrode group G42 may be between the first outer side Si and the second outer side S2 of the first substrate 310.

In addition, the eleventh electrode group G11, the twenty-first electrode group G21, the thirty-first electrode group G31, and the forty-first electrode group G41 may be divided from the twelfth electrode group G12, the twenty-second electrode group G22, the thirty-second electrode group G32, and the forty-second electrode group G42 between a third outer side S3 and a fourth outer side S4 of the first substrate 310.

Here, a first terminal electrode 330T1 and a second terminal electrode 330T2 may be respectively disposed on sides of different electrode groups, for example, on the eleventh electrode group G11 side and the twelfth electrode group G12 side, and the eleventh electrode group G11 and the twelfth electrode group G12 may be connected by a connection electrode CE1. In this case, the connection electrode EC1 may be disposed in a row closest to the first terminal electrode 330T1 and the second terminal electrode 330T2.

Referring to FIG. 23, an eleventh electrode group G11, a twelfth electrode group G12, and a thirteenth electrode group G13 may be divided from a twenty-first electrode group G21, a twenty-second electrode group G22, and a twenty-third electrode group G23 between a first outer side Si and a second outer side S2 of a first substrate 310.

In addition, the eleventh electrode group G11 and the twenty-first electrode group G21, and the twelfth electrode group G12 and the twenty-second electrode group G22 may be divided between a third outer side S3 and a fourth outer side S4 of the first substrate 310, and the twelfth electrode group G12 and the twenty-second electrode group G22, and the thirteenth electrode group G13 and the twenty-third electrode group G23 may be divided between the third outer side S3 and the fourth outer side S4 of the first substrate 110.

Here, a first terminal electrode 330T1 and a second terminal electrode 330T2 may be respectively disposed on sides of different electrode groups, for example, on the eleventh electrode group G11 side and the thirteenth electrode group G13 side, the eleventh electrode group G11 and the twelfth electrode group G12 may be connected by a connection electrode CE11, and the twelfth electrode group G12 and the thirteenth electrode group G13 may be connected by a connection electrode CE12.

Here, the connection electrodes CE11 and CE12 may be disposed in a row closest to the first terminal electrode 330T1 and the second terminal electrode 330T2.

Similarly, referring to FIG. 24, an eleventh electrode group G11, a twelfth electrode group G12, a thirteenth electrode group G13, and a fourteenth electrode group G14 may be divided from a twenty-first electrode group G21, a twenty-second electrode group G22, a twenty-third electrode group G23, and a twenty-fourth electrode group G24 between and a first outer side Si and a second outer side S2 of a first substrate 310.

In addition, the eleventh electrode group G11 and the twenty-first electrode group G21, and the twelfth electrode group G12 and the twenty-second electrode group G22 may be divided between a third outer side S3 and a fourth outer side S4 of the first substrate 110, the twelfth electrode group G12 and the twenty-second electrode group G22, and the thirteenth electrode group G13 and the twenty-third electrode group G23 may be divided between the third outer side S3 and the fourth outer side S4 of the first substrate 110, and the thirteenth electrode group G13 and the twenty-third electrode group G23, and the fourteenth electrode group G14 and the twenty-fourth electrode group G24 may be divided between the third outer side S3 and the fourth outer side S4 of the first substrate 310.

Here, a first terminal electrode 330T1 and a second terminal electrode 330T2 may be respectively disposed on sides of different electrode groups, for example, on the eleventh electrode group G11 side and the fourteenth electrode group G14 side, the eleventh electrode group G11 and the twelfth electrode group G12 may be connected by a connection electrode CE11, the twelfth electrode group G12 and the thirteenth electrode group G13 may be connected by a connection electrode CE12, and the thirteenth electrode group G13 and the fourteenth electrode group G14 may be connected by a connection electrode CE13.

Here, the connection electrodes CE11, CE12, and CE13 may be disposed in a row closest to the first terminal electrode 330T1 and the second terminal electrode 330T2.

Referring to FIGS. 21 and 22, one of the first row electrode groups G11 and G12 may be connected to one of the second row electrode groups G21 and G22 by two connection electrodes CE21 and CE22 disposed side by side adjacent to each other, and one of the second row electrode groups G21 and G22 may be connected to one of the third row electrode groups G31 and G32 by the other two connection electrodes CE31 and CE32 disposed side by side adjacent to each other.

In this case, when the two connection electrodes CE21 and CE22 connect the eleventh electrode group G11 and the twenty-first electrode group G21 disposed on the third outer side S3 side of the first substrate 310, the other two connection electrodes CE31 and CE32 may connect the twenty-second electrode group G22 and the thirty-second electrode group G32 disposed on the fourth outer side S4 side of the first substrate 310. In this case, the two connection electrodes CE21 and CE22 are disposed side by side in two columns closest to the left outermost column of the eleventh electrode group G11 and the twenty-first electrode group G21, and the other two connection electrodes CE31 and CE32 may be disposed side by side in two columns closest to the right outermost column of the twenty-second electrode group G22 and the thirty-second electrode group G32.

Alternatively, when the two connection electrodes CE21 and CE22 connect the twelfth electrode group G12 and the twenty-second electrode group G22 disposed on the fourth outer side S4 side of the first substrate 310, the other two connection electrodes CE31 and CE32 may connect the twenty-first electrode group G21 and the thirty-first electrode group G31 disposed on the third outer side S3 side of the first substrate 310. In this case, the two connection electrodes CE21 and CE22 are disposed in two columns closest to the right outermost column of the twelfth electrode group G12 and the twenty-second electrode group G22, and the other two connection electrodes CE31 and CE32 may be disposed side by side in two columns closest to the left outermost column of the twenty-first electrode group G21 and the thirty-first electrode group G31.

Referring to FIGS. 21 to 24, the first column electrode groups G11, G21, G31, and G41 may be connected to the second column electrode groups G12, G22, G32, and G42 by two connection electrodes CE41 and CE42 disposed side by side adjacent to each other. Likewise, the second column electrode groups G12 and G13 may be connected to the third column electrode groups G13 and G23 by two other connection electrodes CE51 and CE52 disposed side by side adjacent to each other.

In this case, the two connection electrodes CE41 and CE42 may be disposed on the outermost row of the first column electrode groups G11, G21, G31, and G41, and the other two connection electrodes CE51 and CE52 may be disposed on the outermost row of the second column electrode groups G12 and G13.

According to the electrode arrangement structure, a maximum number of thermoelectric legs per unit area may be accommodated even when the second substrate unit 380 is divided into a plurality of electrode substrates, so that high thermoelectric efficiency may be achieved, and the first electrode unit, the semiconductor structure, and the second electrode unit may be electrically connected using a pair of terminal electrodes.

Although not shown in the drawing, when the thermoelectric device according to the embodiment of the present invention is applied to a power generation device using the Seebeck effect, the thermoelectric device may be coupled to a first fluid flow unit and a second fluid flow unit. The first fluid flow unit may be disposed on one of the first substrate and the second substrate of the thermoelectric device, and the second fluid flow unit may be disposed on the other of the first substrate and the second substrate of the thermoelectric device. At least one of the first fluid flow unit and the second fluid flow unit may have a flow path to allow at least one of a first fluid and a second fluid to flow, and in some cases, at least one of the first fluid flow unit and the second fluid flow unit may be omitted, and at least one of the first fluid and the second fluid may flow directly to the substrate of the thermoelectric device. For example, the first fluid may flow adjacent to one of the first substrate and the second substrate, and the second fluid may flow adjacent to the other thereof. Here, a temperature of the second fluid may be higher than a temperature of the first fluid. Accordingly, the first fluid flow unit may be referred to as a cooling unit. In another embodiment, the temperature of the first fluid may be higher than the temperature of the second fluid. Accordingly, the second fluid flow unit may be referred to as a cooling unit. The heat sink 390 may be connected to a substrate of one of the first fluid flow unit and the second fluid flow unit, through which a higher temperature fluid flows. An absolute value of the temperature difference between the first fluid and the second fluid may be greater than or equal to 40° C., preferably greater than or equal to 70° C., and more preferably in a range of 95° C. to 185° C.

Although the exemplary embodiments of the present invention have been described above, it may be understood by those skilled in the art that a variety of modifications and changes may be made without departing from the concept and scope of the present invention disclosed within the range of the following claims.

The invention claimed is:

1. A thermoelectric device comprising:
a first substrate unit;
an insulating layer disposed on the first substrate unit;
a first electrode unit disposed on the insulating layer;
a first terminal electrode and a second terminal electrode which are disposed on the insulating layer and protrude toward a first outer side of the first substrate unit from the first electrode unit;
a semiconductor structure disposed on the first electrode unit;
a second electrode unit disposed on the semiconductor structure; and a second substrate unit disposed on the second electrode unit,
wherein the second substrate unit includes a plurality of second substrates disposed to be spaced apart from each other,
wherein the first electrode unit includes a plurality of electrode groups vertically overlapping the plurality of second substrates, respectively, and a plurality of connection electrodes configured to connect two different electrode groups among the plurality of electrode groups,
wherein a long side of each of the connection electrodes is longer than a long side of a first electrode included in the plurality of electrode groups, and
wherein at least a portion of the each of the connection electrodes is disposed not to vertically overlap the plurality of second substrates,
wherein the plurality of electrode groups include a first electrode group and a second electrode group which are divided between the first outer side and a second outer side opposite to the first outer side,
wherein the first electrode group includes a 1-1 electrode group and a 1-2 electrode group divided between a third outer side perpendicular to the first outer side and a fourth outer side opposite to the third outer side,
wherein the second electrode group includes a 2-1 electrode group and a 2-2 electrode group divided between the third outer side and the fourth outer side,
wherein the first terminal electrode is connected to the 1-1 electrode group, and the second terminal electrode is connected to the 1-2 electrode group,
wherein the 1-1 electrode group and the 2-1 electrode group are connected by two connection electrodes of the plurality of connection electrodes,
wherein the 2-1 electrode group and the 2-2 electrode group are connected by two connection electrodes of the plurality of connection electrodes, and
wherein the 1-1 electrode group and the 1-2 electrode group are connected by three connection electrodes of the plurality of connection electrodes.

2. The thermoelectric device of claim 1, wherein:
one of the three connection electrodes connecting the 1-1 electrode group and the 1-2 electrode group is disposed in a row closest to the first terminal electrode and the second terminal electrode in the 1-1 electrode group and the 1-2 electrode group.

3. The thermoelectric device of claim 1, wherein:
the two connection electrodes connecting the 1-1 electrode group and the 2-1 electrode group are disposed side by side adjacent to each other.

4. The thermoelectric device of claim 3, wherein the two connection electrodes connecting the 1-1 electrode group and the 2-1 electrode group are disposed in two columns closest to an outermost column in the 1-1 electrode group and the 2-1 electrode group.

5. The thermoelectric device of claim 1, wherein:
a connection electrode is not disposed between the 1-2 electrode group and the 2-2 electrode group.

6. The thermoelectric device of claim 2, wherein:
two of the three connection electrodes connecting the 1-1 electrode group and the 1-2 electrode group are disposed side by side in uppermost two rows in the 1-1 electrode group and the 1-2 electrode group.

7. The thermoelectric device of claim 6, wherein:
connecting the 2-1 electrode group and the 2-2 electrode group are disposed side by side in lowermost two rows in the 2-1 electrode group and the 2-2 electrode group.

8. The thermoelectric device of claim 1, wherein:
the insulating layer includes a first insulating layer disposed on the first substrate unit, and a second insulating layer disposed on the first insulating layer and having an area less than an area of the first insulating layer, and
the second insulating layer includes an overlap region vertically overlapping the second substrate unit and a protrusion pattern protruding toward the first outer side of the first substrate unit from the overlap region.

9. The thermoelectric device of claim 8, wherein:
the protrusion pattern includes a first protrusion pattern and a second protrusion pattern disposed to be spaced apart from each other,
the first terminal electrode is disposed on the first protrusion pattern, and
the second terminal electrode is disposed on the second protrusion pattern.

10. The thermoelectric device of claim 1, wherein:
the plurality of electrode groups are disposed to be spaced apart from each other on the insulating layer, and
the thermoelectric device further includes a dummy unit disposed between the plurality of electrode groups on the insulating layer.

11. The thermoelectric device of claim 10, wherein the dummy unit includes a plurality of dummy structures each having the same shape and size as each electrode included in each of the plurality of electrode groups and disposed to be spaced apart from each other.

12. The thermoelectric device of claim 11, wherein each of the dummy structures includes a metal layer or a resin layer.

13. The thermoelectric device of claim 10, wherein:
the dummy unit includes a first dummy unit disposed between the 1-1 electrode group and the 1-2 electrode group, a second dummy unit disposed between the 2-1 electrode group and the 2-2 electrode group, and a third dummy unit disposed between the first electrode group and the second electrode group.

14. The thermoelectric device of claim 13, wherein the first dummy unit and the second dummy unit are disposed to be spaced apart from each other.

* * * * *